(12) United States Patent
Yoshimura et al.

(10) Patent No.: US 10,446,749 B1
(45) Date of Patent: Oct. 15, 2019

(54) MEMORY DEVICE

(71) Applicant: Toshiba Memory Corporation, Minato-ku (JP)

(72) Inventors: Yoko Yoshimura, Yokkaichi (JP); Hiromichi Kuriyama, Kuwana (JP); Shoichi Kabuyanagi, Yokkaichi (JP); Yuuichi Kamimuta, Yokkaichi (JP); Chika Tanaka, Fujisawa (JP); Masumi Saitoh, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/134,289

(22) Filed: Sep. 18, 2018

(30) Foreign Application Priority Data

Mar. 23, 2018 (JP) .................................. 2018-055400

(51) Int. Cl.
*H01L 45/00* (2006.01)
*H01L 27/24* (2006.01)
(Continued)

(52) U.S. Cl.
CPC ...... *H01L 45/1233* (2013.01); *G11C 13/0007* (2013.01); *G11C 13/0026* (2013.01);
(Continued)

(58) Field of Classification Search
CPC ............... H01L 45/1233; H01L 45/146; H01L 27/11585; H01L 27/11597; H01L 27/2481
See application file for complete search history.

(56) References Cited

U.S. PATENT DOCUMENTS 7,995,371 B2 * 8/2011 Rinerson .................. G11C 7/02
365/148
8,575,590 B2   11/2013 Muraoka et al.
(Continued)

FOREIGN PATENT DOCUMENTS

JP    2012-119566    6/2012
JP    2014-53571     3/2014
(Continued)

OTHER PUBLICATIONS

Robertson, J "Band offsets of wide-band-gap oxides and implications for future electronic devices", J. Vac. Sci. Technol. B 18 No. 3, 2000, pp. 8.

(Continued)

*Primary Examiner* — Allison Bernstein
(74) *Attorney, Agent, or Firm* — Oblon, McClelland, Maier & Neustadt, L.L.P.

(57) ABSTRACT

A memory device according to an embodiment includes a first conductive layer extending in a first direction, a second conductive layer extending in the first direction, a third conductive layer extending in a second direction intersecting the first direction, an insulating layer containing aluminum oxide provided between the first conductive layer and the second conductive layer, and a first insulating film including a first region located between the first conductive layer and the third conductive layer and a second region located between the insulating layer and the third conductive layer. The first region includes hafnium oxide mainly formed as an orthorhombic. The second region includes hafnium oxide mainly formed as crystals other than the orthorhombic.

12 Claims, 20 Drawing Sheets

(51) Int. Cl.
*G11C 13/00* (2006.01)
*H01L 27/11597* (2017.01)

(52) U.S. Cl.
CPC .... *G11C 13/0028* (2013.01); *H01L 27/11597* (2013.01); *H01L 27/2481* (2013.01)

(56) References Cited

U.S. PATENT DOCUMENTS

| | | | |
|---|---|---|---|
| 8,987,702 B2 * | 3/2015 | Mouli | H01L 27/1021 |
| | | | 257/5 |
| 9,362,487 B2 * | 6/2016 | Inumiya | H01L 43/10 |
| 9,425,237 B2 | 8/2016 | Jo | |
| 9,761,798 B2 | 9/2017 | Kamimuta et al. | |
| 9,859,337 B2 | 1/2018 | Ratnam et al. | |
| 9,941,299 B1 * | 4/2018 | Chen | H01L 27/11597 |
| 2011/0210303 A1 | 9/2011 | Muraoka et al. | |
| 2013/0134382 A1 | 5/2013 | Martens et al. | |
| 2016/0359109 A1 | 12/2016 | Kamimuta et al. | |

FOREIGN PATENT DOCUMENTS

| | | |
|---|---|---|
| JP | 2014-175419 | 9/2014 |
| JP | 2015-170610 | 9/2015 |
| JP | 2017-5061 | 1/2017 |
| WO | WO 2010/026625 A1 | 3/2010 |

OTHER PUBLICATIONS

Woo, J. et al., "Multi-layer Tunnel Barrier ($Ta_2O_5$/$TaO_x$/$TiO_2$) Engineering for Bipolar RRAM Selector Applications", Symposium on VLSI Technology Digest of Technical Papers, 2013, pp. 2.

* cited by examiner

COMPARATIVE EXAMPLE 1
:SINGLE LAYERED

COMPARATIVE EXAMPLE 2
:EA1<EA2, EA2>EA3

COMPARATIVE EXAMPLE 3
:EA1>EA2, EA2<EA3

US 10,446,749 B1

MEMORY DEVICE

CROSS-REFERENCE TO RELATED APPLICATION

This application is based upon and claims the benefit of priority from Japanese Patent Application No. 2018-055400, filed on Mar. 23, 2018, the entire contents of which are incorporated herein by reference.

FIELD

Embodiments described herein relate generally to a memory device.

BACKGROUND

A ferroelectric memory has attracted attention as a nonvolatile memory. As the ferroelectric memory, for example, a two-terminal type memory such as a ferroelectric tunnel junction (FTJ) memory in which a ferroelectric film is provided between two electrodes or a three-terminal type memory in which a gate insulating film of a transistor is a ferroelectric film is used.

The ferroelectric memory uses polarization inversion of ferroelectrics to write data into a memory cell and erase data of a memory cell. When the ferroelectric memory is scaled-down, memory characteristics may degrade due to an interference between adjacent memory cells.

DETAILED DESCRIPTION

Figure 1:
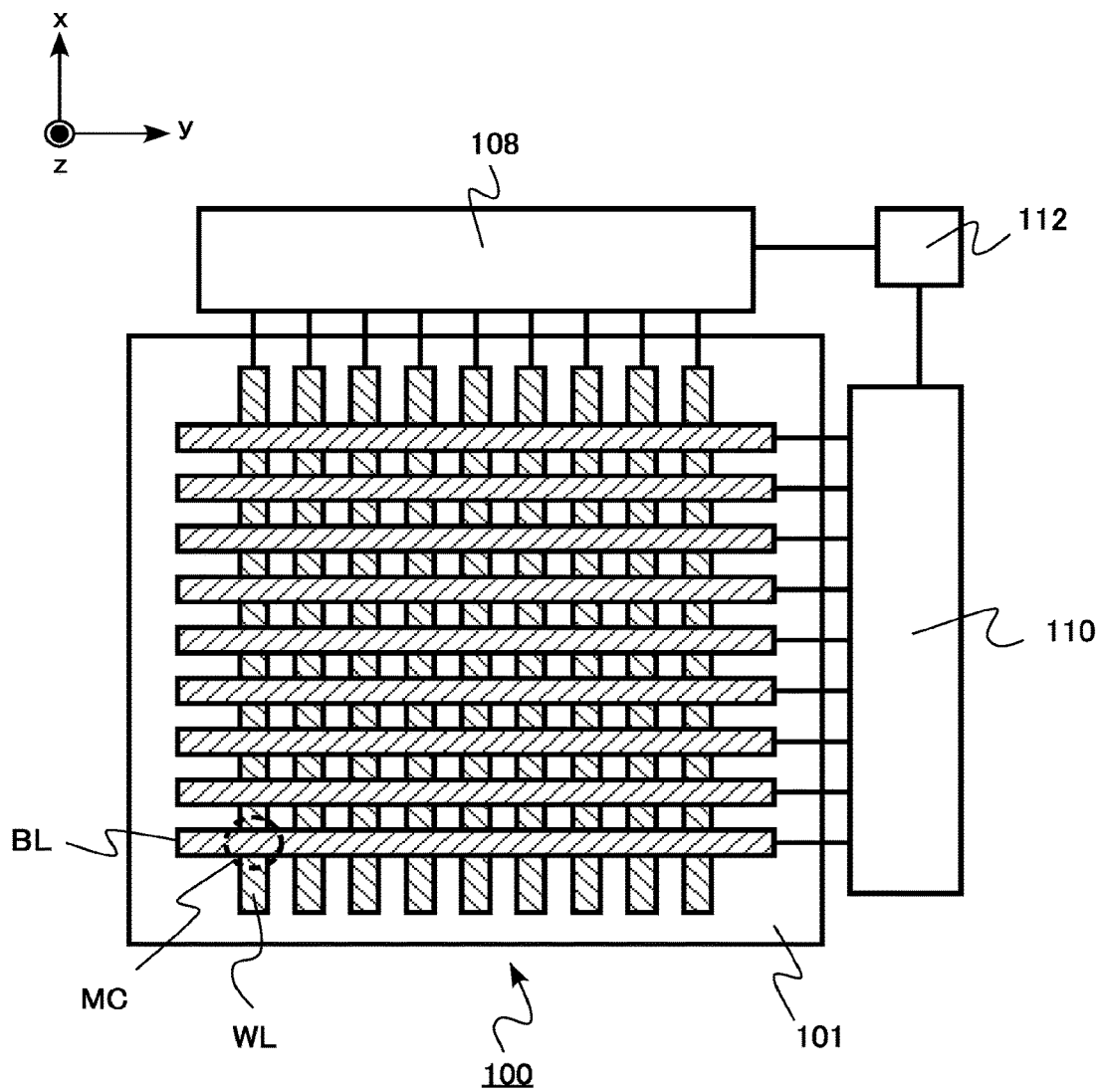
FIG. 1 is a block diagram of a memory cell array and a peripheral circuit of a memory device according to a first embodiment.

A memory device according to an embodiment includes a first conductive layer extending in a first direction, a second conductive layer extending in the first direction, a third conductive layer extending in a second direction intersecting the first direction, an insulating layer including aluminum oxide provided between the first conductive layer and the second conductive layer, and a first insulating film including a first region located between the first conductive layer and the third conductive layer and a second region located between the insulating layer and the third conductive layer. The first region includes hafnium oxide whose main crystal structure is orthorhombic. The second region includes hafnium oxide whose main crystal structure is crystal structure other than orthorhombic.

Hereinafter, embodiments of the present disclosure will be described with reference to the drawings. In the following description, the same or similar members or the like are denoted by the same reference numerals, and a description of members and the like which are once described is omitted as appropriate.

In addition, in the present specification, the term "above" or "below" may be used for the sake of convenience. "Above" or "below" is a term indicating a relative positional relationship within the drawings and is not a term defining a positional relationship with respect to gravity.

Qualitative analysis and quantitative analysis on chemical compositions of members constituting the memory device in this specification can be performed, for example, by secondary ion mass spectroscopy (SIMS), and energy dispersive X-ray spectroscopy (EDX). In addition, for measuring the thickness of the members constituting the memory device, the distance between the members, and the like, for example, it is possible to use a transmission electron microscope (TEM). For example, X-ray photoelectron spectroscopy (XPS) can be used for identifying the crystal system of the members constituting the memory device and comparing the magnitude of the existence ratio of the crystal system.

"Ferroelectrics" in the present specification means a substance which has spontaneous polarization without applying an electric field from the outside, and inverts polarization when an electric field is applied from the outside. In addition, in the present specification, "paraelectrics" means a substance in which polarization is generated when an electric field is applied and polarization disappears when an electric field is removed.

In the present specification, the term "metal" is a generic term for substances exhibiting metallic properties, and for example, metal nitrides exhibiting metallic properties are also included in the range of "metal".

First Embodiment

A memory device according to a first embodiment includes a first conductive layer extending in a first direction, a second conductive layer extending in the first direction, a third conductive layer extending in a second direction intersecting the first direction, an insulating layer including aluminum oxide provided between the first conductive layer and the second conductive layer, and a first insulating film including a first region located between the first conductive layer and the third conductive layer and a second region located between the insulating layer and the third conductive layer. The first region includes hafnium oxide whose main crystal structure is orthorhombic. The second region includes hafnium oxide whose main crystal structure is crystal structure other than orthorhombic.

FIG. 1 is a block diagram of a memory cell array 100 and a peripheral circuit of a memory device according to a first embodiment. The memory device of the first embodiment is an FTJ memory. A region indicated by a dotted circle in the memory cell array 100 of FIG. 1 is one memory cell MC.

Hereinafter, an x direction shown in FIGS. 1, 2A, 2B, and 2C is defined as a first direction, a y direction is defined as a second direction, and a z direction is defined as a third direction.

The memory cell array 100 of the memory device according to the first embodiment includes, for example, a plurality of word lines WLs and a plurality of bit lines BLs intersecting the word lines WLs on a semiconductor substrate 101 with an insulating layer interposed therebetween. The word line WL is provided under the bit line BL. In addition, a first control circuit 108, a second control circuit 110, and a sense circuit 112 are provided around the memory cell array 100 as peripheral circuits.

A plurality of memory cells MCs are provided in a region where the word line WL intersects the bit line BL. The memory device of the first embodiment is an FTJ memory having a cross point structure. The memory cell MC is a two-terminal element.

Each of the plurality of word lines WLs is connected to the first control circuit 108. In addition, each of the plurality of bit lines BLs is connected to the second control circuit 110. The sense circuit 112 is connected to the first control circuit 108 and the second control circuit 110.

For example, the first control circuit 108 and the second control circuit 110 select a desired memory cell MC and have a function of wiring data into the memory cell, reading the data of the memory cell, erasing the data of the memory cell, and the like. When data are read out, the data of the memory cell is read out as the amount of current flowing between the word line WL and the bit line BL. The sense circuit 112 has a function of determining the current amount and determining polarity of the data. For example, the sense circuit 112 determines "0" or "1" of data. The sense circuit 112 determines the amount of tunnel current flowing in the memory cell to determine the polarity of the data.

The first control circuit 108, the second control circuit 110, and the sense circuit 112 are constituted by electronic circuits using semiconductor devices formed on the semiconductor substrate 101, for example.

Figure 2A:
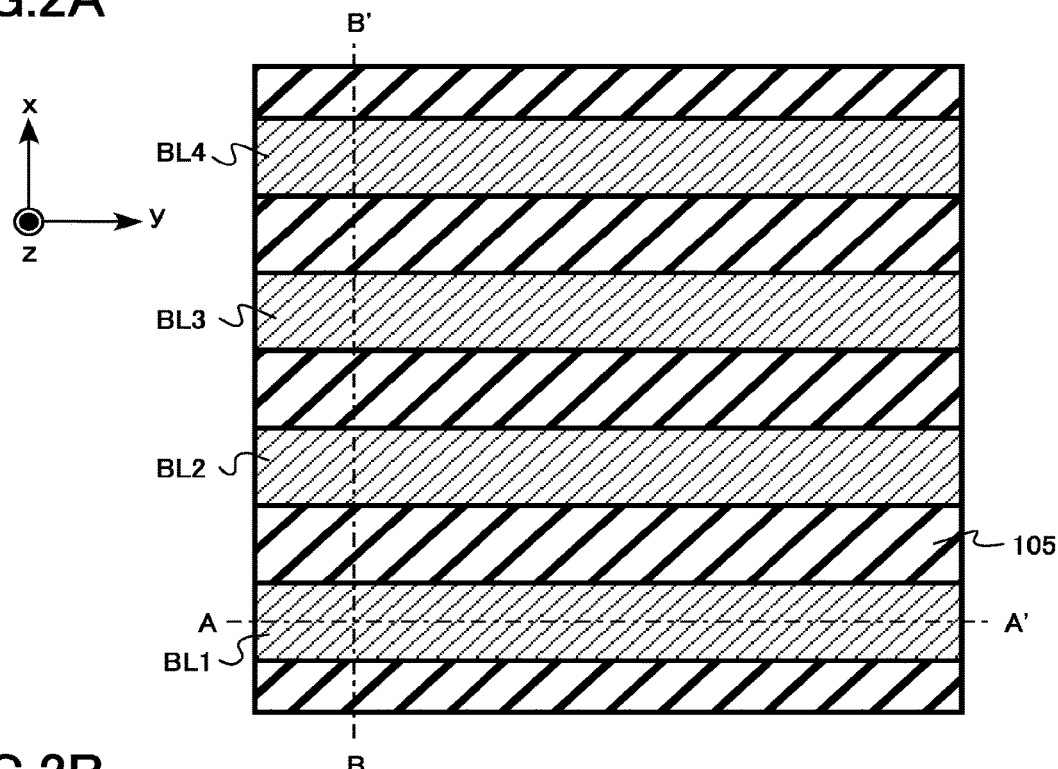
FIGS. 2A, 2B, and 2C are schematic views of a part of the memory cell array of the memory device of the first embodiment.
Figure 2B:
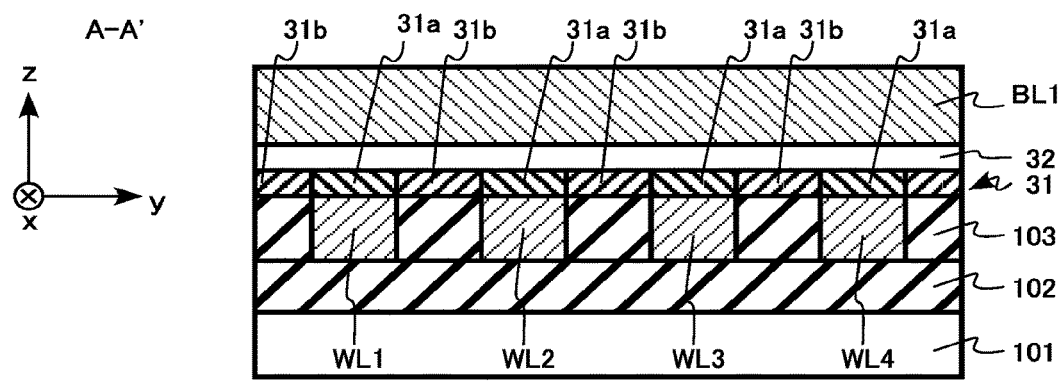
Figure 2C:
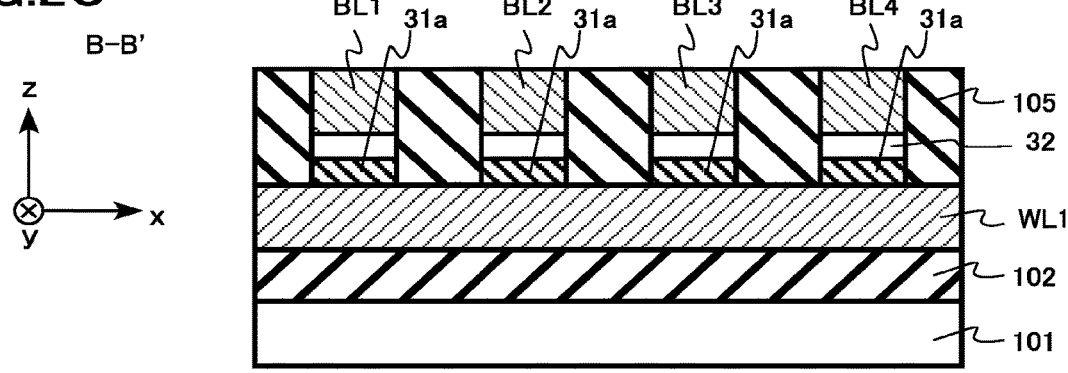

FIGS. 2A, 2B, and 2C are schematic views of a part of the memory cell array 100 of a memory device of the first embodiment. FIG. 2A is a top view, FIG. 2B is a cross-sectional view taken along the direction A-A' of FIG. 2A, and FIG. 2C is a cross-sectional view taken along the direction B-B' of FIG. 2A.

The memory cell array 100 includes a word line WL1 (a first conductive layer), a word line WL2 (a second conductive layer), a word line WL3, a word line WL4, a bit line BL1 (a third conductive layer), a bit line BL2, a bit line BL3, a bit line BL4, a first insulating film 31, a second insulating film 32, the semiconductor substrate 101, a first interlayer insulating layer 102, a second interlayer insulating layer 103 (insulating layer), and a third interlayer insulating layer 105. Hereinafter, the word line WL1 (the first conductive layer), the word line WL2 (the second conductive layer), the word line WL3, and the word line WL4 may be collectively referred to simply as the word line WL. In addition, the bit line BL1 (the third conductive layer), the bit line BL2, the bit line BL3, and the bit line BL4 may be collectively referred to simply as the bit line BL.

The word line WL extends in the x direction (the first direction). The word line WL is made of, for example, metal. The word line WL is made of, for example, metal having high heat resistance. The word line WL is made of, for example, titanium nitride (TiN), tungsten nitride (WN), tantalum nitride (TaN), tungsten (W), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt).

The bit line BL extends in the y direction (the second direction). The y direction (second direction) is orthogonal to the x direction. The bit line BL is made of, for example, metal. The bit line BL is made of, for example, metal having high heat resistance. The bit line BL is made of, for example, tungsten (W), titanium nitride (TiN), tungsten nitride (WN), tantalum nitride (TaN), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt).

The word line WL1 is an example of a first conductive layer. The word line WL2 is an example of a second conductive layer. The bit line BL1 is an example of a third conductive layer.

The semiconductor substrate 101 is, for example, a silicon substrate.

The first interlayer insulating layer 102 is provided on the semiconductor substrate 101. The first interlayer insulating layer 102 is provided between the semiconductor substrate 101 and the word line WL. The first interlayer insulating layer 102 includes, for example, silicon oxide.

The second interlayer insulating layer 103 is provided between the word line WL and the word line WL. The second interlayer insulating layer 103 includes aluminum oxide. The second interlayer insulating layer 103 is an example of an insulating layer. The second interlayer insulating layer 103 is located under the first insulating film 31.

The third interlayer insulating layer 105 is provided on the word line WL. The third interlayer insulating layer 105 is provided between the bit line BL and the bit line BL. The third interlayer insulating layer 105 includes, for example, silicon oxide.

The first insulating film 31 is provided between the word line WL and the bit line BL and between the second interlayer insulating layer 103 and the bit line BL. The first insulating film 31 includes hafnium oxide. The first insulating film 31 is segmented between the bit line BL and the bit line BL.

The first insulating film 31 includes hafnium oxide including, as an additive element, at least one element selected from the group consisting of, for example, silicon (Si), titanium (Ti), zirconium (Zr), aluminum (Al), yttrium (Y), strontium (Sr), lanthanum (La), cerium (Ce), gadolinium (Gd), and barium (Ba). The first insulating film 31 may include hafnium oxide not including an additive element.

The first insulating film 31 includes a first region 31a located between the word line WL and the bit line BL and a second region 31b located between the second interlayer insulating layer 103 and the bit line EL. The first region 31a exists right on the word line WL, and the second region 31b exists right on the second interlayer insulating layer 103. The first region 31a and the second region 31b alternately exist in the y direction in the first insulating film 31.

The first region 31a between the word line WL2 (the second conductive layer) and the bit line BL1 (the third conductive layer) is an example of the third region.

A thickness of the first insulating film 31 is, for example, 3 nm or more and 10 nm or less.

The first region 31a includes hafnium oxide mainly formed as an orthorhombic. More specifically, the hafnium oxide in the first region 31a is hafnium oxide mainly formed as orthorhombic III (space group $Pbc2_1$, space group number 29). The first region 31a includes hafnium oxide whose main crystal structure is orthorhombic. The word "main crystal structure" means the crystal structure occupying the largest ratio among the crystal structures in the hafnium oxide. Among the crystal structures of the hafnium oxide included in the first region 31a, a ratio occupied by the orthorhombic is the largest.

The first region 31a includes ferroelectrics. The hafnium oxide exhibiting ferroelectricity is orthorhombic.

The second region 31b includes hafnium oxide mainly formed as crystals other than the orthorhombic. The second region 31b includes hafnium oxide whose main crystal structure is crystal structure other than orthorhombic. Among the crystal structures of the hafnium oxide included in the second region 31b, the ratio occupied by crystal structure other than the orthorhombic is the largest. In addition to the orthorhombic, there are cubic, hexagonal, tetragonal, monoclinic, and triclinic.

The second region 31b includes paraelectrics. The hafnium oxide formed as crystal structure other than the orthorhombic exhibits the paraelectricity.

The first region 31a and the second region 31b are regions in a film formed at the same time. The compositions of the first region 31a and the second region 31b are substantially the same. The compositions of the first region 31a and the second region 31b are the same within a range of errors in compositions in the film at the time of the film formation. The compositions are expressed by atomic percentage of elements included in the first region 31a and the second region 31b.

The second insulating film 32 is provided between the first insulating film 31 and the bit line BL.

The second insulating film 32 does not contain aluminum oxide. The second insulating film 32 includes, for example, oxide, nitride, or oxynitride. The second insulating film 32 includes, for example, silicon oxide or titanium oxide. The second insulating film 32 includes, for example, paraelectrics.

A thickness of the second insulating film 32 is, for example, 0.5 nm or more and 2 nm or less.

Next, a method for manufacturing the memory device according to the first embodiment will be described.

FIGS. 3A, 3B, 3C and 3D are schematic cross-sectional views showing an example of a method for manufacturing a memory device according to the first embodiment. FIGS. 3A, 3B, 3C and 3D show cross sections corresponding to the sectional view of FIG. 2B. That is, it shows a cross section including a y direction and a z direction.

First, a first interlayer insulating layer 102 is formed on a semiconductor substrate 101. The first interlayer insulating layer 102 includes, for example, silicon oxide. The first interlayer insulating layer 102 is formed by, for example, the film formation by a chemical vapor deposition (CVD) method. Next, the plurality of word lines WLs are formed on the first interlayer insulating layer 102. The word line WL is formed by, for example, a film formation by the CVD method, and patterning by a lithography method and a reactive ion etching (RIE) method.

Figure 3A:
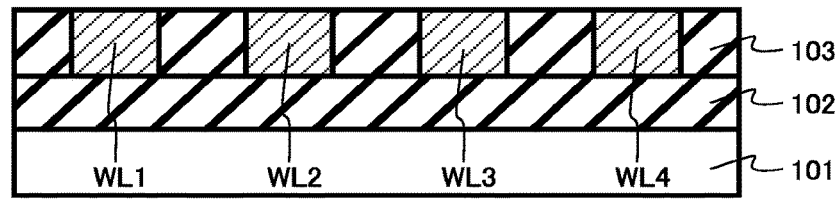
FIGS. 3A, 3B, 3C and 3D are schematic cross-sectional views showing an example of a method for manufacturing a memory device according to the first embodiment.

Next, the second interlayer insulating layer 103 is formed between the word lines WLs (FIG. 3A). The second interlayer insulating layer 103 includes aluminum oxide. The second interlayer insulating layer 103 is formed by, for example, the film formation by the CVD method and planarization by a chemical mechanical polishing (CMP) method.

Next, a first insulating film 31 is formed on the word line WL and the second interlayer insulating layer 103. The first insulating film 31 is hafnium oxide. The hafnium oxide is amorphous just after the film formation. The first insulating film 31 is formed by, for example, an atomic layer deposition (ALD) method.

Figure 3B:
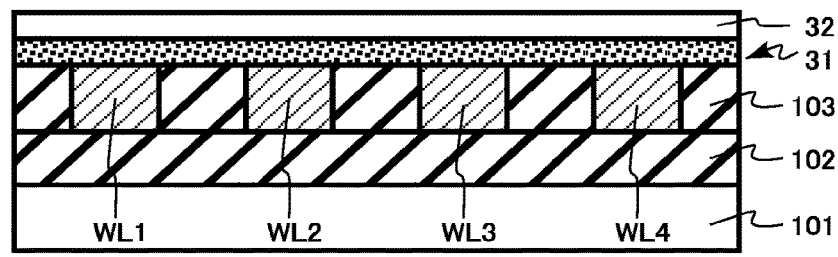

Next, a second insulating film 32 is formed on the first insulating film 31 (FIG. 3B). The second insulating film 32 is formed by, for example, the CVD method. The second insulating film 32 includes, for example, silicon oxide.

Figure 3C:
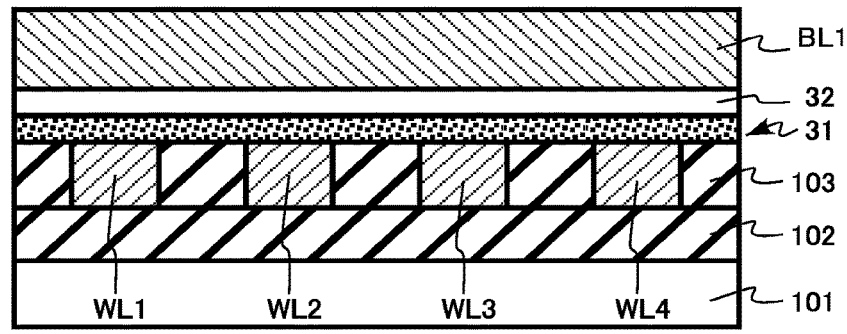

Next, a bit line BL is formed on the second insulating film 32 (FIG. 3C). The bit line BL is formed by, for example, the film formation by the CVD method, and the patterning by the lithography method and the RIE method.

After forming the bit line BL, the second insulating film 32 and the first insulating film 31 between the bit line and the bit line are removed. The removal of the second insulating film 32 and the first insulating film 31 is performed by, for example, the RIE method using the bit line BL as a mask.

Next, the third interlayer insulating layer 105 is formed on the word line WL exposed between the bit lines BLs. The third interlayer insulating layer 105 includes, for example, silicon oxide. The third interlayer insulating layer 105 is formed by, for example, the film formation by the CVD method and the planarization by the CMP method.

Figure 3D:
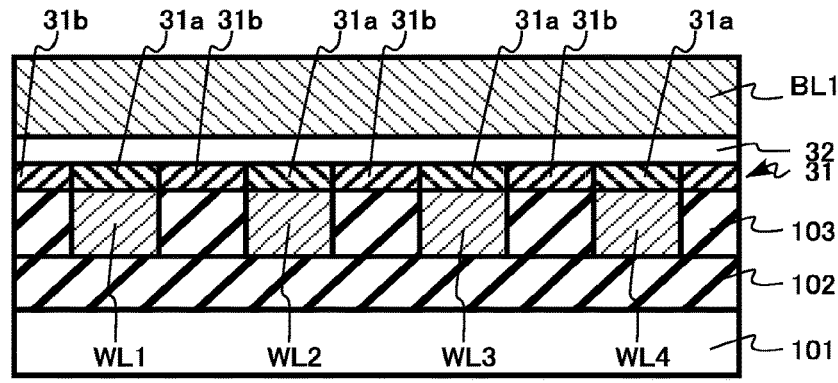

Next, heat treatment is performed to crystallize hafnium oxide of the first insulating film 31 (FIG. 3D). The heat treatment is performed, for example, in a nitrogen gas atmosphere at a temperature of 600° C. or more and 1050° C. or less for 1 second or more and 30 seconds or less. The heat treatment is so-called crystallization annealing.

By the heat treatment, the hafnium oxide between the word line WL and the bit line BL is crystallized to be orthorhombic. On the other hand, the hafnium oxide between the second interlayer insulating layer 103 and the bit line BL is crystallized, but does not become orthorhombic, but becomes crystals other than the orthorhombic.

By the heat treatment, a first region 31a between the word line WL and the bit line BL and a second region 31b between the second interlayer insulating layer 103 and the bit line BL are formed in the first insulating film 31. The first region 31a includes hafnium oxide mainly formed as the orthorhombic.

The second region 31b includes hafnium oxide mainly formed as crystals other than the orthorhombic.

According to the above manufacturing method, the memory device of the first embodiment shown in FIGS. 2A, 2B, and 2C is manufactured.

Next, functions and effects of the memory device according to the first embodiment will be described.

First, an operation principle of the FTJ memory will be briefly described with the memory device of the comparative example as an example.

Figure 4:
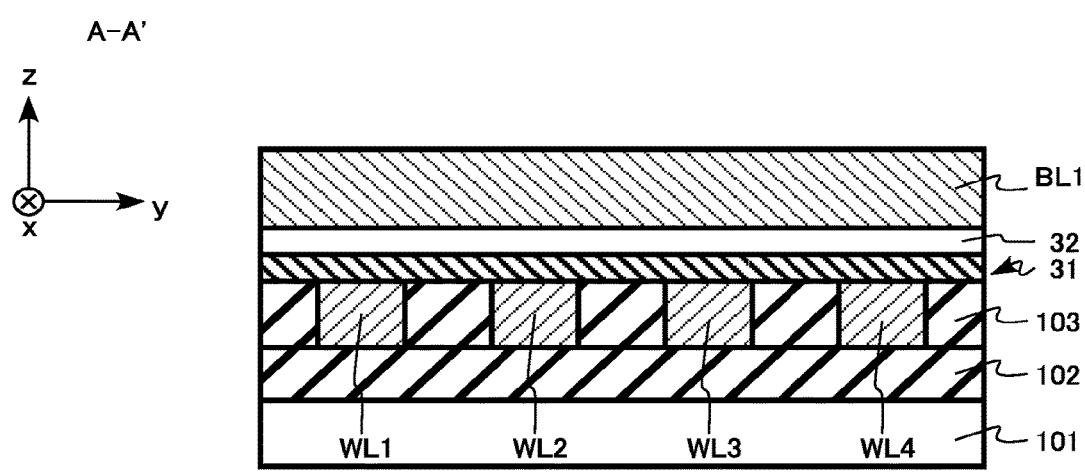
FIG. 4 is a schematic diagram of a part of a memory cell array of a memory device of a comparative example.

FIG. 4 is a schematic diagram of a part of a memory cell array of the memory device of the comparative example. FIG. 4 shows a cross section corresponding to the cross-sectional view of FIG. 2B of the first embodiment. That is, it shows a cross section including the y direction and the z direction.

As shown in FIG. 4, the memory cell array of the comparative example is different from the first embodiment in that the first insulating film 31 is not segmented into the first region 31a and the second region 31b. The first insulating film 31 of the comparative example includes hafnium oxide entirely formed as the orthorhombic. In addition, the second interlayer insulating layer 103 of the memory cell array of the comparative example is different from the first embodiment in that it does not contain aluminum oxide. The second interlayer insulating layer 103 of the comparative example includes, for example, silicon oxide.

In the FTJ memory, by changing a voltage applied between the word line WL and the bit line BL, polarization inversion of the first insulating film 31 including ferroelectrics is caused. A shape of a tunnel barrier formed by the first insulating film 31 and the second insulating film 32 is changed by the polarization state of the first insulating film 31. A tunnel current flowing between the word line WL and the bit line BL is changed by the change in the shape of the tunnel barrier.

For example, when an off state (high resistance state) in which the tunnel current hardly flows is defined as data "0" and an on state (low resistance state) in which the tunnel current easily flows is defined as data "1", a memory cell MC can store 1 bit data of "0" and "1".

When the ferroelectric memory is scaled-down, memory characteristics may degrade due to inter-cell interference between adjacent memory cells. For example, as an interval between the word lines WLs is narrow due to the scaling-down, the polarization state of the first insulating film 31 below adjacent word lines WLs changes due to the voltage applied to the word line WL, such that erroneous writing may occur. For example, it is conceivable that interference occurs between cells in which a size of a polarization domain of ferroelectrics becomes equal to an interval between the word lines WLs due to the scaling-down.

According to the investigation by the inventors, it became clear that the hafnium oxide in contact with the aluminum oxide does not form an orthorhombic structure when the crystallization annealing is performed and does not exhibit ferroelectricity.

Figure 5A:
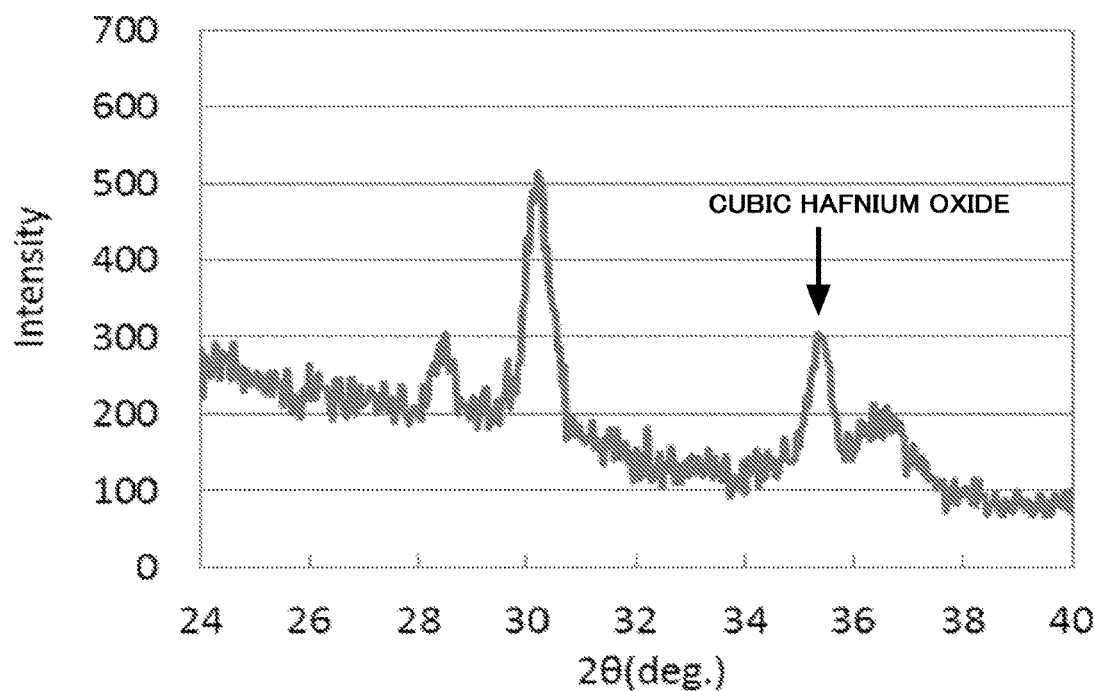
FIGS. 5A and 5B are explanatory diagrams of functions and effects of the memory device according to the first embodiment.
Figure 5B:
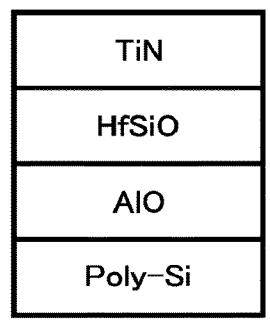

FIGS. 5A and 5B are explanatory diagrams of functions and effects of the memory device according to the first embodiment. FIG. 5A is a diagram showing measurement results by XPS. FIG. 5B is a view showing a cross-sectional structure of a sample used for measurement.

As shown in FIG. 5B, the sample has a stacked structure of polycrystalline silicon (Poly-Si)/aluminum oxide (AlO)/silicon-added hafnium oxide (HfSiO)/titanium nitride (TiN). This sample was subjected to the crystallization annealing at 1000° C. for 10 seconds.

As shown in FIG. 5A, as the measurement result by the XPS, a peak of cubic hafnium oxide was detected but a peak of orthorhombic hafnium oxide was not detected. When the same heat treatment was performed on the sample in which the aluminum oxide was replaced by the silicon oxide in the same stacked structure, the peak of the orthorhombic hafnium oxide was detected.

In the memory device of the first embodiment, the second interlayer insulating layer 103 between two word lines WLs includes the aluminum oxide. Therefore, the first insulating film 31 between the two word lines WLs is in contact with the aluminum oxide during the crystallization annealing of the hafnium oxide. Therefore, the second region 31b mainly formed as crystals other than the orthorhombic is formed in the first insulating film 31 between the second interlayer insulating layer 103 and the bit line BL.

On the other hand, the first insulating film 31 between the word line WL and the bit line BL is not in contact with the second interlayer insulating layer 103. In addition, the second insulating film 32 in contact with the first insulating film 31 does not contain aluminum oxide. Therefore, the first insulating film 31 between the word line WL and the bit line BL is not in contact with aluminum oxide. Therefore, the first region 31a mainly formed as an orthorhombic is formed in the first insulating film 31 between the word line WL and the bit line BL.

The memory device of the first embodiment has a structure in which the ferroelectrics under two word lines WLs is physically segmented by the paraelectrics. Therefore, the degradation of memory characteristics due to the inter-cell interference is suppressed.

From the viewpoint of exhibiting the ferroelectricity in the hafnium oxide, it is preferable that the word line WL is metal nitride. For example, it is preferable that the word line WL is titanium nitride (TiN), tungsten nitride (WN), or tantalum nitride (TaN). It is preferable that the word line WL is, in particular, titanium nitride (TiN).

It is preferable that the bit line BL is metal from the viewpoint of low resistance. The bit line BL preferably includes tungsten or titanium nitride because it has the low resistance and good consistency with the manufacturing process of the existing semiconductor device.

It is preferable that the hafnium oxide of the first insulating film 31 includes least one element selected from the group consisting of, for example, silicon (Si), titanium (Ti), zirconium (Zr), aluminum (Al), yttrium (Y), strontium (Sr), lanthanum (La), cerium (Ce), gadolinium (Gd), and barium (Ba). By including the above elements, ferroelectricity is easily exhibited in the hafnium oxide.

From the viewpoint of exhibiting the ferroelectricity in the hafnium oxide, it is preferable that the second insulating film 32 includes silicon oxide or titanium oxide.

The third interlayer insulating layer 105 provided between the bit line BL and the bit line BL includes, for example, a material having a dielectric constant lower than that of the aluminum oxide. The third interlayer insulating layer 105 includes, for example, silicon oxide. The second interlayer insulating layer 103 provided between the word line WL and the word line WL includes the aluminum oxide in order to form the second region 31b. The third interlayer insulating layer 105 between the bit line BL and the bit line BL includes a material having a low dielectric constant, such that capacitance between interconnections can be reduced, and high-speed memory operation and low power consumption can be realized.

As described above, according to the first embodiment, the ferroelectrics under the word line WL is physically segmented from the ferroelectrics under the adjacent word lines WLs. Therefore, the memory device in which the degradation of the memory characteristics due to the inter-cell interference is suppressed can be realized.

Second Embodiment

A memory device of a second embodiment is different from the first embodiment in that the memory cell array has a three-dimensional structure. Hereinafter, a description of the contents overlapping with the first embodiment is partially omitted.

Figure 6:
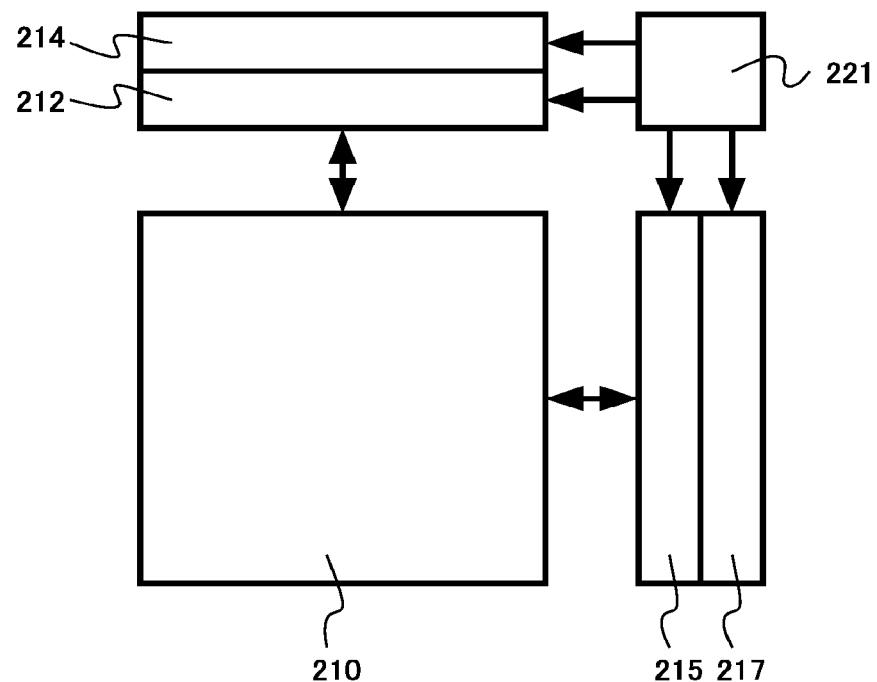
FIG. 6 is a block diagram of a memory device according to a second embodiment.
Figure 7:
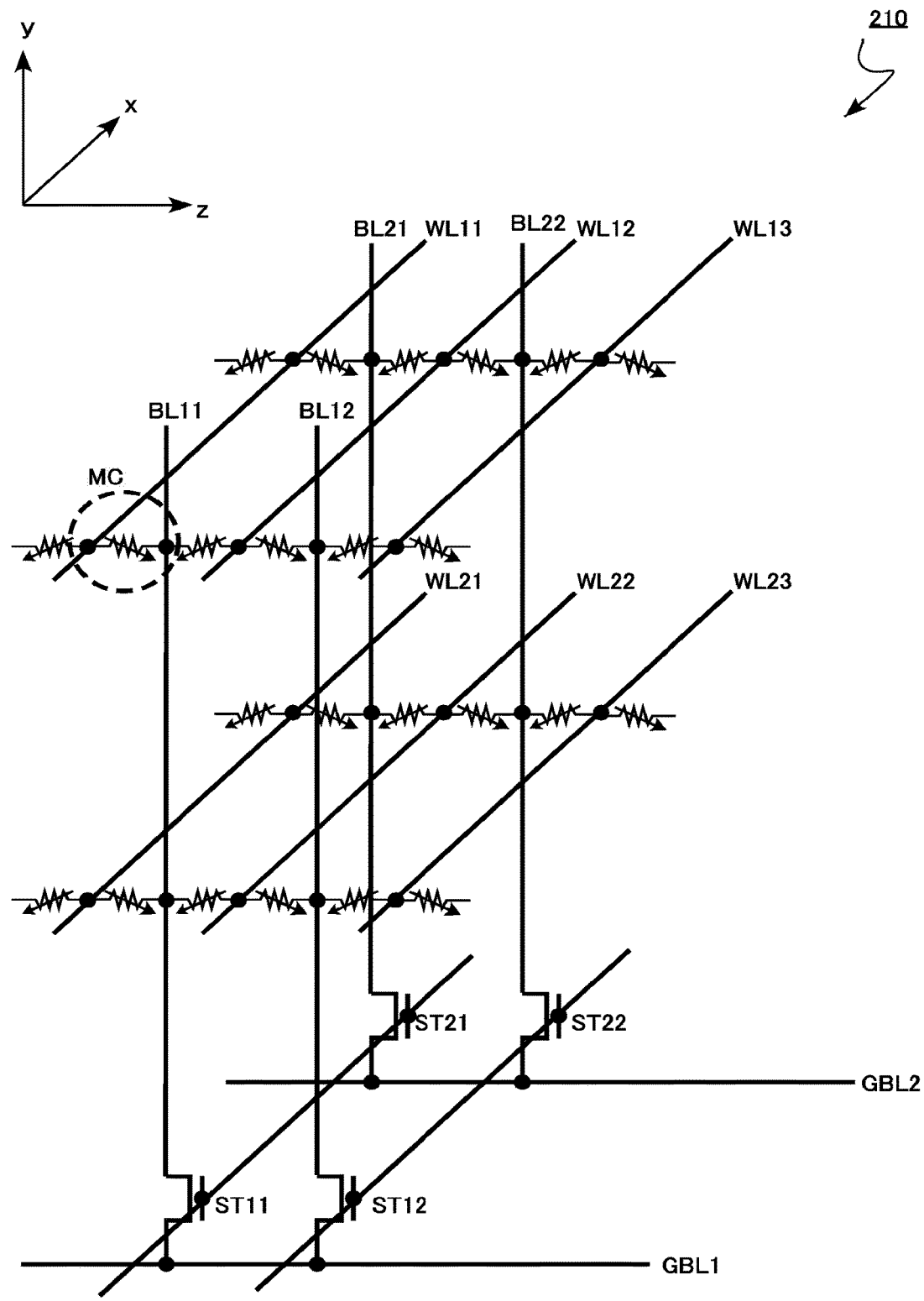
FIG. 7 is an equivalent circuit diagram of a memory cell array of the memory device according to the second embodiment.

FIG. 6 is a block diagram of a memory device according to a second embodiment. FIG. 7 is an equivalent circuit diagram of a memory cell array of the memory device according to the second embodiment. FIG. 7 schematically shows a wiring structure in a memory cell array. A memory cell array 210 of the second embodiment has a three-dimensional structure in which memory cell MCs are three-dimensionally arranged.

As shown in FIG. 6, the memory device includes a memory cell array 210, a word line driver circuit 212, a row decoder circuit 214, a sense amplifier circuit 215, a column decoder circuit 217, and a control circuit 221.

In addition, as shown in FIG. 7, the plurality of memory cells MCs are three-dimensionally arranged in the memory cell array 210. In FIG. 7, a region surrounded by a dotted line corresponds to one memory cell MC.

Figure 8A:
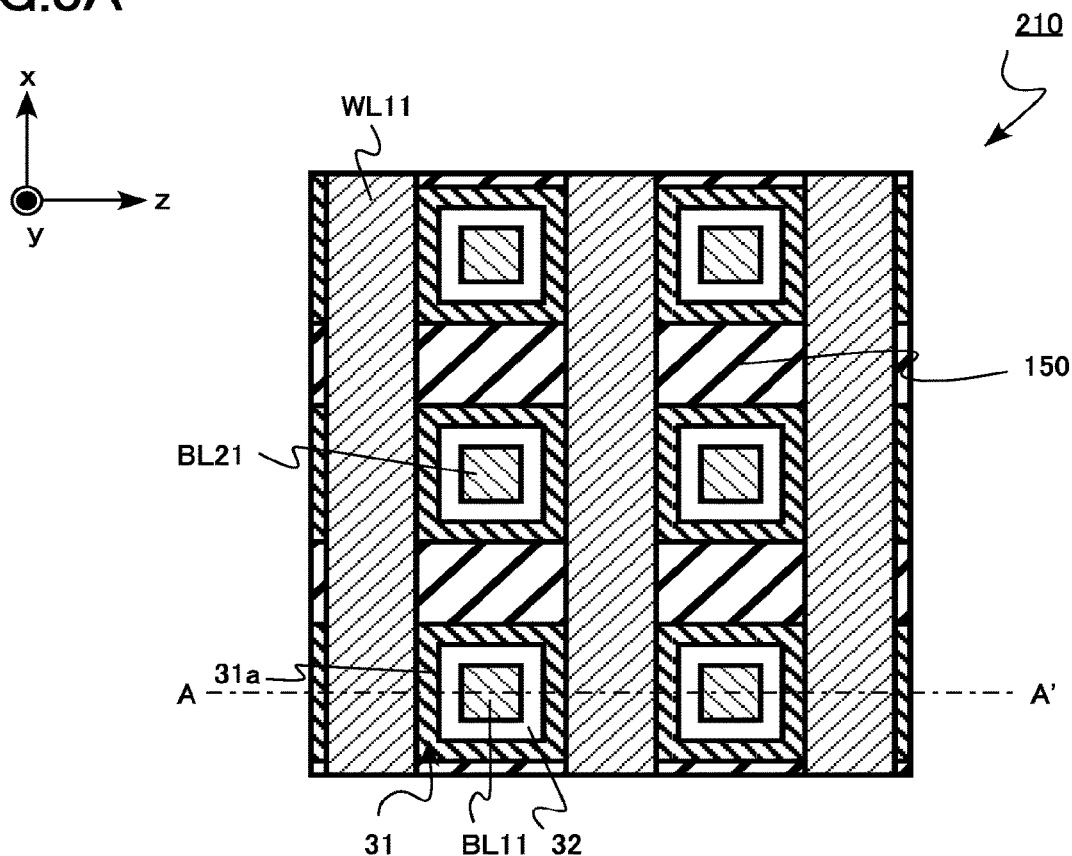
FIGS. 8A and 8B are schematic views of a part of the memory cell array of the memory device according to the second embodiment.
Figure 8B:
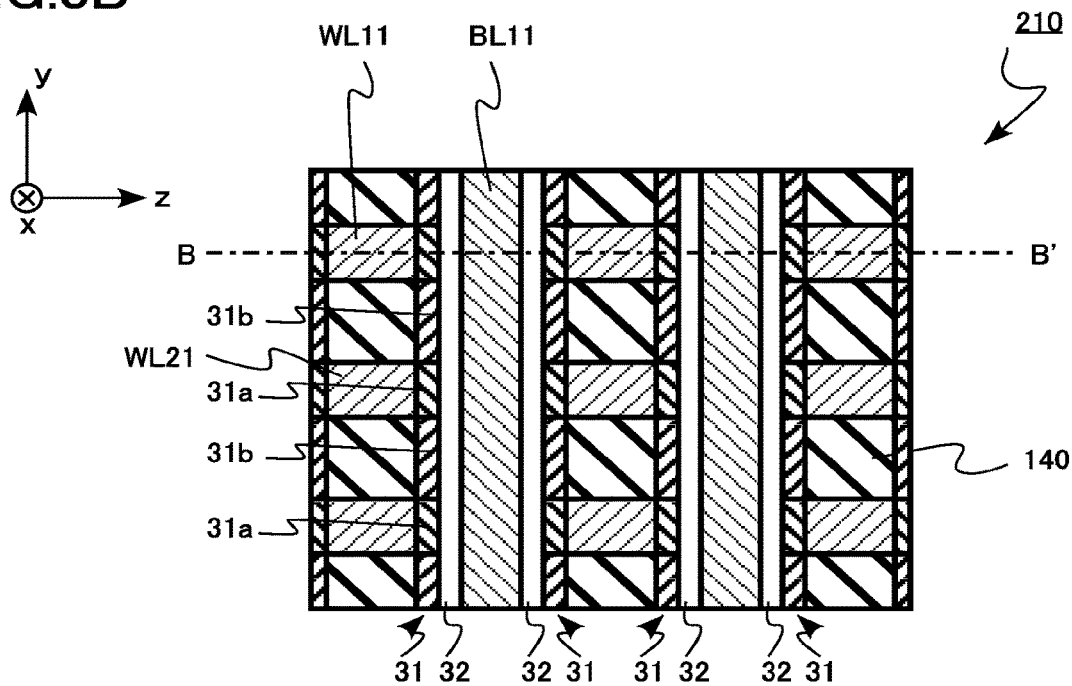

Hereinafter, as shown in FIGS. 7, 8A, and 8B, an x direction is defined as a first direction, a y direction is defined as a second direction, and a z direction is defined as a third direction.

The memory cell array 210 includes, for example, a plurality of word lines WLs (WL11, WL12, WL13, WL21, WL22, and WL23) and a plurality of bit lines BLs (BL11, BL12, BL21, and BL22). The word line WL extends in the x direction. The bit line BL extends in the y direction. The word line WL intersects the bit line BL vertically. The memory cells MCs are arranged at intersections of the word lines WLs and the bit lines BLs.

The plurality of word lines WLs are electrically connected to the row decoder circuit 214. The plurality of bit lines BLs are connected to the sense amplifier circuit 215. Selection transistors STs (ST11, ST21, ST12, and ST22) and global bit lines GBLs (GBL1 and GBL2) are provided between the plurality of bit lines BLs and the sense amplifier circuit 215.

The row decoder circuit 214 has a function of selecting the word line WL according to the input row address signal. The word line driver circuit 212 has a function of applying a predetermined voltage to the word line WL selected by the row decoder circuit 214.

The column decoder circuit 217 has a function of selecting the bit line BL according to the input column address signal. The sense amplifier circuit 215 has a function of applying a predetermined voltage to the bit line BL selected by the column decoder circuit 217. In addition, the sense amplifier circuit 215 has a function of detecting and amplifying a current flowing between the selected word line WL and the selected bit line BL.

The control circuit 221 has a function of controlling the word line driver circuit 212, the row decoder circuit 214, the sense amplifier circuit 215, the column decoder circuit 217, and other circuits (not shown).

Circuits such as the word line driver circuit 212, the row decoder circuit 214, the sense amplifier circuit 215, the column decoder circuit 217, and the control circuit 221 are constituted by, for example, a transistor using a semiconductor layer (not shown) and a wiring layer.

FIGS. 8A and 8B are schematic views of a part of the memory cell array 210 of the memory device according to the second embodiment. FIG. 8A is a cross-sectional view taken along xz of the memory cell array 210. FIG. 8B is a cross-sectional view taken along yz of the memory cell array 210. FIG. 8A is a cross-sectional view taken along line BB' of FIG. 8B, and FIG. 8B is a cross-sectional view taken along line AA' of FIG. 8A.

The memory cell array 210 includes a plurality of word lines including the word line WL11 (a first conductive layer) and the word line WL21 (a second conductive layer), a plurality of bit lines including the bit line BL11 (a third conductive layer) and the bit line BL21, a first insulating film 31, a second insulating film 32, a first interlayer insulating layer 140 (insulating layer), and a second interlayer insulating layer 150. Hereinafter, the plurality of word lines including the word line WL11 (the first conductive layer) and the word line WL12 (the second conductive layer) may be collectively referred to as simply the word line WL. In addition, the plurality of bit lines including the bit line BL11 (the third conductive layer) and the bit line BL12 may be collectively referred to as simply the bit line BL.

The word lines WLs are alternately stacked in the y direction (the second direction) with the first interlayer insulating layer 140. The word line WL extends in the x direction (the first direction).

The word line WL is made of, for example, metal. The word line WL is made of, for example, titanium nitride.

The first interlayer insulating layer 140 is provided between the word line WL and the word line WL. The first interlayer insulating layer 140 includes aluminum oxide. The first interlayer insulating layer 140 is an example of an insulating layer.

The bit line BL is provided between the word line WL and the word line WL. The bit line BL extends in the y direction (the second direction).

The bit line BL is made of, for example, metal or semiconductor. The bit line BL is made of, for example, titanium nitride or tungsten.

The second interlayer insulating layer 150 is provided between the bit line BL and the bit line BL. The second interlayer insulating layer 150 includes, for example, silicon oxide.

The first insulating film 31 is provided between the word line WL and the bit line BL and between the first interlayer insulating layer 140 and the bit line BL. The first insulating film 31 is provided surrounding the bit line BL. The first insulating film 31 includes hafnium oxide.

The first insulating film 31 includes hafnium oxide including at least one element selected from the group consisting of, for example, silicon (Si), titanium (Ti), zirconium (Zr), aluminum (Al), yttrium (Y), strontium (Sr), lanthanum (La), cerium (Ce), gadolinium (Gd), and barium (Ba). The first insulating film 31 may include hafnium oxide not including an additive element.

The first insulating film 31 includes a first region 31a located between the word line WL and the bit line BL and a second region 31b located between the first interlayer insulating layer 140 and the bit line BL.

The first region 31a between the word line WL21 (the second conductive layer) and the bit line BL11 (the third conductive layer) is an example of the third region.

A thickness of the first insulating film 31 is, for example, 3 nm or more and 10 nm or less.

The first region 31a includes hafnium oxide mainly formed as the orthorhombic. More specifically, the hafnium oxide in the first region 31a includes hafnium oxide mainly formed as orthorhombic III (space group $Pbc2_1$, space group number 29). Among the crystals of the hafnium oxide included in the first region 31a, a ratio occupied by the orthorhombic is the largest.

The first region 31a includes ferroelectrics. The hafnium oxide exhibiting ferroelectricity is orthorhombic.

The second region 31b includes hafnium oxide mainly formed as crystals other than the orthorhombic. Among the crystals of the hafnium oxide included in the second region 31b, the ratio occupied by the crystals other than the orthorhombic is the largest. In addition to the orthorhombic, there are cubic, hexagonal, tetragonal, monoclinic, and triclinic.

The second region 31b includes paraelectrics. The hafnium oxide formed as crystal structure other than the orthorhombic exhibits the paraelectricity.

The first region 31a and the second region 31b are regions in a film formed at the same time. The compositions of the first region 31a and the second region 31b are substantially the same. The compositions of the first region 31a and the second region 31b are the same within a range of errors in compositions in the film at the time of the film formation.

The second insulating film 32 is provided between the first insulating film 31 and the bit line BL. The second insulating film 32 is provided surrounding the bit line BL.

The second insulating film 32 does not contain aluminum oxide. The second insulating film 32 includes, for example, oxide, nitride, or oxynitride. The second insulating film 32 includes, for example, silicon oxide or titanium oxide. The second insulating film 32 includes, for example, paraelectrics.

A thickness of the second insulating film 32 is, for example, 0.5 nm or more and 2 nm or less.

The second interlayer insulating layer 150 provided between the bit line BL and the bit line BL includes, for example, a material having a dielectric constant lower than that of the aluminum oxide. The second interlayer insulating layer 150 includes, for example, silicon oxide. The first interlayer insulating layer 140 provided between the word line WL and the word line WL includes the aluminum oxide in order to form the second region 31b. The second interlayer insulating layer 150 between the bit line BL and the bit line BL is made of a material having a low dielectric constant, such that capacitance between interconnections can be reduced, and high-speed memory operation and low power consumption can be realized.

Next, an example of a method for manufacturing the memory device according to the second embodiment will be described.

First, a laminate in which a conductive layer for forming a word line WL and the first interlayer insulating layer 140 are alternately stacked in the y direction (the second direction) is formed on a substrate (not shown). The conductive layer includes, for example, titanium nitride. The first interlayer insulating layer 140 includes, for example, aluminum oxide.

Next, grooves parallel to an xy plane are formed in the laminate. A line and space pattern extending in the x direction is formed on the laminate by the lithography method. The groove is formed by alternately etching the first interlayer insulating layer 140 and the conductive layer in the space portion by the RIE method.

By forming grooves parallel to the xy plane on the laminate, the word line WL extending in the x direction is formed. The first interlayer insulating layer 140 is provided between regular word lines WLs.

Next, the grooves formed in the laminate are buried with the second interlayer insulating layer 150. The second interlayer insulating layer 150 includes, for example, silicon oxide. Next, holes are formed in the laminate.

For example, the line and space pattern extending in the z direction is formed on the laminate by the lithography method. By selectively etching the second interlayer insulating layer 150 in the space portion with respect to the word line WL and the first interlayer insulating layer 140, holes are formed in the laminate.

The first insulating film 31 is formed on a side surface of the hole formed in the laminate. The first insulating film 31 includes, for example, hafnium oxide. The hafnium oxide is amorphous just after the film formation. The first insulating film 31 is formed by, for example, the ALD method.

Next, the second insulating film 32 is formed on the first insulating film 31. The second insulating film 32 is formed by, for example, the CVD method. The second insulating film 32 includes, for example, silicon oxide.

Next, the bit line BL is formed on the second insulating film 32. The bit line BL is formed, for example, by the CVD method. The hole is buried by the bit line BL.

Next, heat treatment is performed to crystallize hafnium oxide of the first insulating film 31. The heat treatment is performed, for example, in a nitrogen gas atmosphere at a temperature of 600° C. or more and 1050° C. or less for 1 second or more and 30 seconds or less. The heat treatment is so-called crystallization annealing.

By the heat treatment, the hafnium oxide between the word line WL and the bit line BL is crystallized to be orthorhombic. On the other hand, the hafnium oxide between the first interlayer insulating layer 140 and the bit line BL is crystallized, but does not become orthorhombic, but becomes crystals other than the orthorhombic.

By the heat treatment, a first region 31a between the word line WL and the bit line BL and a second region 31b between the first interlayer insulating layer 140 and the bit line BL are formed in the first insulating film 31. The first region 31a includes hafnium oxide mainly formed as the orthorhombic. The second region 31b includes hafnium oxide mainly formed as crystals other than the orthorhombic.

According to the above manufacturing method, the memory device of the second embodiment shown in FIGS. 8A and 8B is manufactured.

As described above, according to the second embodiment, as in the first embodiment, it is possible to realize a memory device in which the degradation of the memory characteristics due to the inter-cell interference is suppressed. In addition, by providing the three-dimensional structure, it is possible to obtain the effect that the integration of the memory device is improved.

Third Embodiment

A memory device of a third embodiment is different from the first embodiment in that the memory cell array has a three-dimensional structure. In addition, the third embodiment is different from the first and second embodiments in that a memory cell is a three-terminal type memory in which a gate insulating film of a transistor is a ferroelectric film. A description of the contents overlapping with the first and second embodiments will partially omitted.

The memory device of the third embodiment is a three-dimensional NAND flash memory in which memory cells are three-dimensionally arranged. The memory device of the third embodiment is a ferroelectric memory in which a gate insulating film of a memory cell transistor MT is a ferroelectric film.

Figure 9:
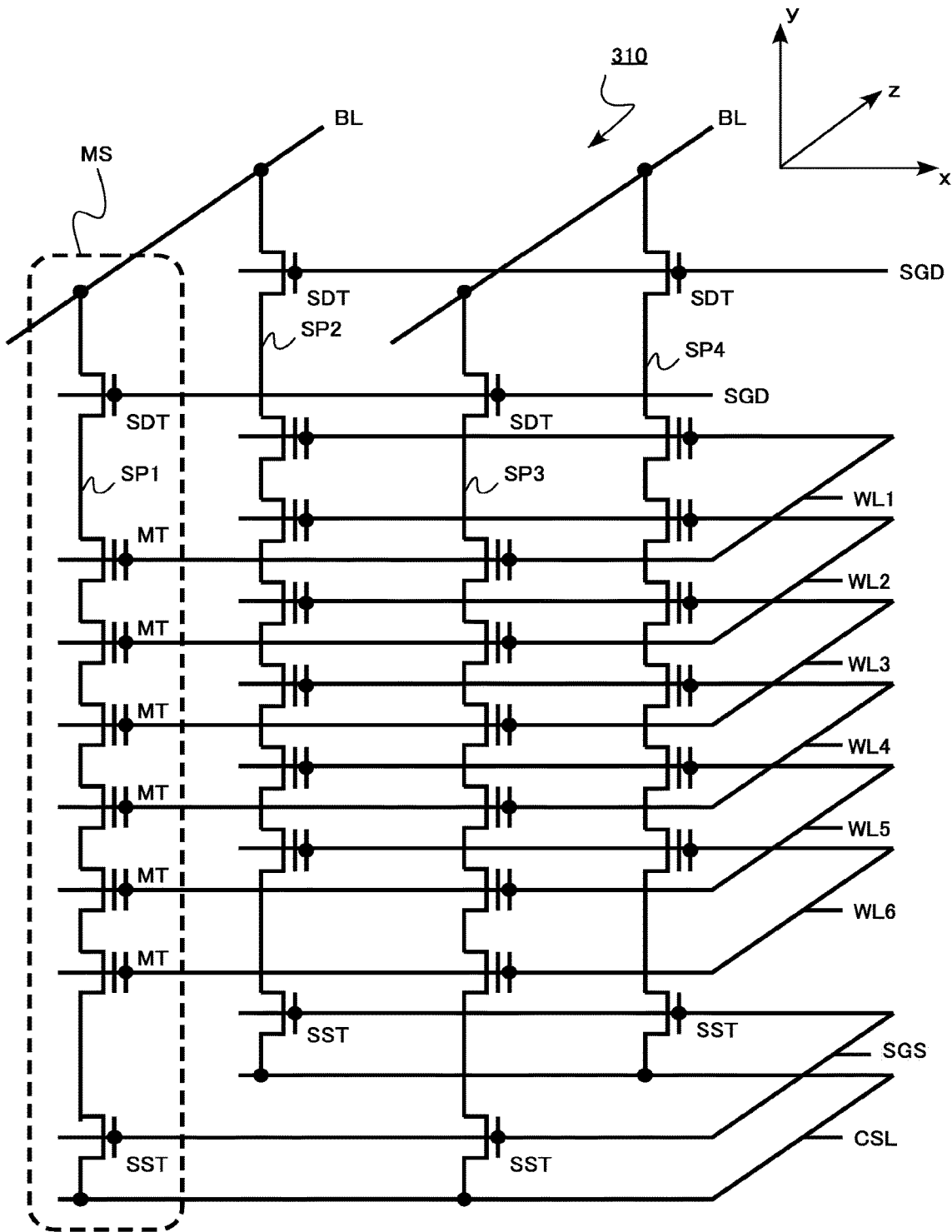
FIG. 9 is an equivalent circuit diagram of a memory cell array of a memory device according to a third embodiment.

FIG. 9 is an equivalent circuit diagram of a memory cell array of the memory device according to the third embodiment. FIG. 9 schematically shows a wiring structure in a memory cell array. A memory cell array 310 of the third embodiment has a three-dimensional structure in which memory cell transistors MTs are three-dimensionally arranged.

As shown in FIG. 9, the memory cell array 310 includes a plurality of word lines WLs including a word line WL1 (a first conductive layer) and a word line WL2 (a second conductive layer), a plurality of semiconductor pillars SPs including a semiconductor pillar SP1 (a third conductive layer) and a semiconductor pillar SP2, a common source line CSL, a source selection gate line SGS, a plurality of drain selection gate lines SGDs, a plurality of bit lines BLs, and a plurality of memory strings MSs.

As shown in FIG. 9, the memory string MS includes source selection transistors SSTs connected in series between a common source line CSL and bit line BL, a plurality of memory cell transistors MTs, and a drain selection transistor SDT.

Figure 10A:
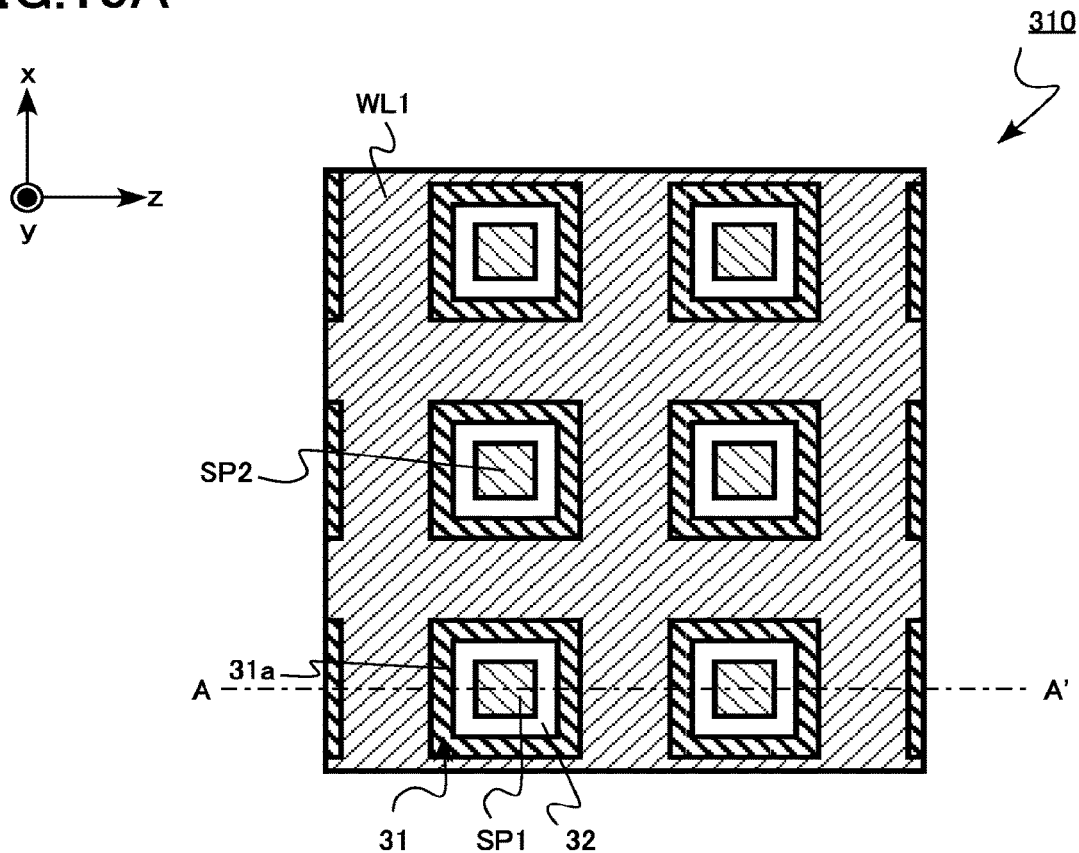
FIGS. 10A and 10B are schematic views of a part of the memory cell array of the memory device according to the third embodiment.
Figure 10B:
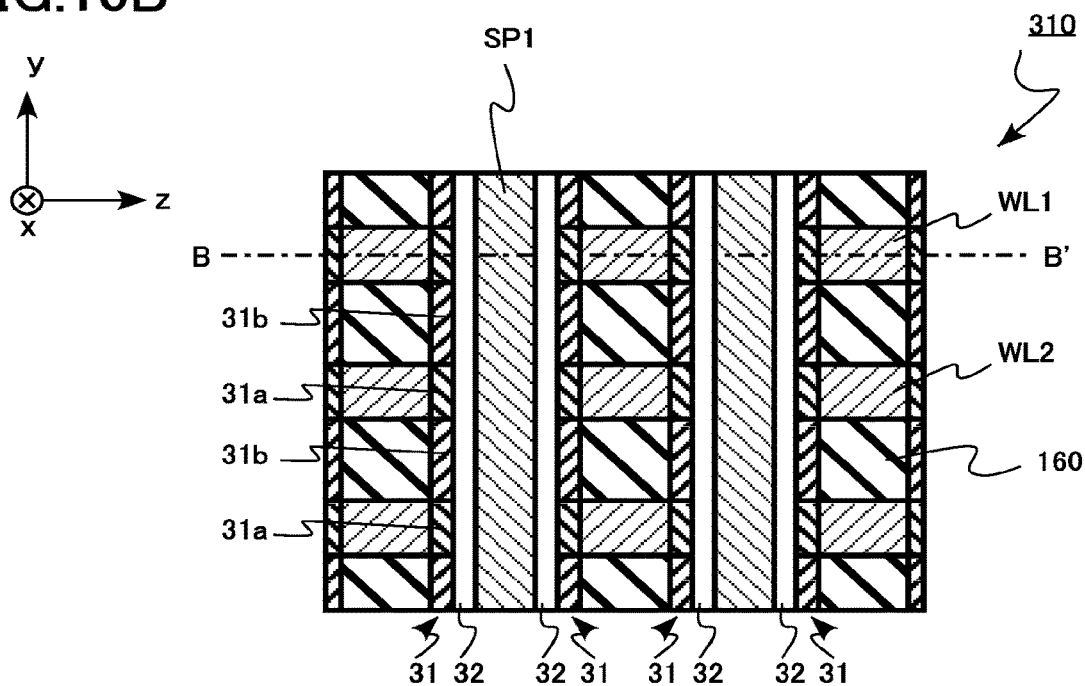

Hereinafter, as shown in FIGS. 9, 10A, and 10B, an x direction is defined as a first direction, a y direction is defined as a second direction, and a z direction is defined as a third direction.

FIGS. 10A and 10B are schematic views of a part of the memory cell array 310 of the memory device according to the third embodiment. FIG. 10A is a cross-sectional view taken along xz of the memory cell array 310. FIG. 10B is a cross-sectional view taken along yz of the memory cell array 310. FIG. 10A is a cross-sectional view taken along line BB' of FIG. 10B, and FIG. 10B is a cross-sectional view taken along line AA' of FIG. 10A.

The memory cell array 310 includes the plurality of word lines WLs including the word line WL1 (the first conductive layer) and the word line WL2 (the second conductive layer), the plurality of semiconductor pillars SPs including the semiconductor pillar SP1 (the third conductive layer) and the semiconductor pillar SP2, a first insulating film 31, a second insulating film 32, and an interlayer insulating layer 160 (insulating layer). Hereinafter, the plurality of word lines including the word line WL1 (the first conductive layer) and the word line WL2 (the second conductive layer) may be collectively referred to simply as the word line WL. In addition, the plurality of semiconductor pillars including the semiconductor pillar SP1 (the third conductive layer) and the semiconductor pillar SP2 may be collectively referred to simply as the semiconductor pillar SP.

The word lines WLs are alternately stacked in the y direction (the second direction) with the interlayer insulating layer 160. The word line WL extends in the x direction (the first direction) and the z direction (the third direction). The word line WL is on a flat plate.

The word line WL is made of, for example, metal or semiconductor. The word line WL is made of, for example, titanium nitride.

The interlayer insulating layer 160 is provided between the word line WL and the word line WL. The interlayer insulating layer 160 includes aluminum oxide. The interlayer insulating layer 160 is an example of an insulating layer.

The semiconductor pillar SP is provided penetrating through the word line WL and the interlayer insulating layer 160. The semiconductor pillar SP extends in the y direction (the second direction).

The semiconductor pillar SP includes semiconductor. The semiconductor pillar SP includes, for example, polycrystalline silicon. The semiconductor pillar SP includes, for example, n-type silicon.

The first insulating film 31 is provided between the word line WL and the semiconductor pillar SP and between the interlayer insulating layer 160 and the semiconductor pillar SP. The first insulating film 31 is provided surrounding the semiconductor pillar SP. The first insulating film 31 includes hafnium oxide.

The first insulating film 31 includes hafnium oxide including at least one element selected from the group consisting of, for example, silicon (Si), titanium (Ti), zirconium (Zr), aluminum (Al), yttrium (Y), strontium (Sr), lanthanum (La), cerium (Ce), gadolinium (Gd), and barium (Ba). The first insulating film 31 may include hafnium oxide not including an additive element.

The first insulating film 31 includes a first region 31a located between the word line WL and the semiconductor pillar SP and a second region 31b located between the interlayer insulating layer 160 and the semiconductor pillar SP.

A thickness of the first insulating film 31 is, for example, 3 nm or more and 10 nm or less.

The first region 31a includes hafnium oxide mainly formed as the orthorhombic. More specifically, the hafnium oxide in the first region 31a includes hafnium oxide mainly formed as orthorhombic III (space group $Pbc2_1$, space group number 29). Among the crystals of the hafnium oxide included in the first region 31a, a ratio occupied by the orthorhombic is the largest.

The first region 31a includes ferroelectrics. The hafnium oxide exhibiting ferroelectricity is orthorhombic.

The second region 31b includes hafnium oxide mainly formed as crystals other than the orthorhombic. Among the crystals of the hafnium oxide included in the second region 31b, the ratio occupied by the crystals other than the orthorhombic is the largest. In addition to the orthorhombic, there are cubic, hexagonal, tetragonal, monoclinic, and triclinic.

The second region 31b includes paraelectrics. The hafnium oxide formed as crystals other than the orthorhombic exhibits the paraelectricity.

The first region 31a and the second region 31b are regions in a film formed at the same time. The compositions of the first region 31a and the second region 31b are substantially the same. The compositions of the first region 31a and the second region 31b are the same within a range of errors in compositions in the film at the time of the film formation.

The second insulating film 32 is provided between the first insulating film 31 and the semiconductor pillar SP. The second insulating film 32 is provided surrounding the semiconductor pillar SP.

The second insulating film 32 does not contain aluminum oxide. The second insulating film 32 includes, for example, oxide, nitride, or oxynitride. The second insulating film 32 includes, for example, silicon oxide or titanium oxide. The second insulating film 32 includes, for example, paraelectrics.

A thickness of the second insulating film 32 is, for example, 0.5 nm or more and 2 nm or less.

The first insulating film 31 and the second insulating film 32 serve as the gate insulating film of the memory cell transistor MT. Due to the polarization inversion state of the first insulating film 31, a threshold voltage of the memory cell transistor MT is changed. As the threshold voltage of the memory cell transistor MT is changed, anon current of the memory cell transistor MT is changed. For example, when a state in which an on current having a high threshold voltage is low is defined as data "0" and a state in which an on current having a low threshold voltage is high is defined as data "1", the memory cell transistor MT can store 1 bit data of "0" and "1".

The configuration in which the second insulating film 32 is omitted and only the first insulating film 31 functions as the gate insulating film of the memory cell transistor MT is possible.

Next, an example of a method for manufacturing the memory device according to the third embodiment will be described.

First, a laminate in which the word line WL and the interlayer insulating layer 160 are alternately stacked in the y direction (the second direction) is formed on a substrate (not shown). The word line WL is made of, for example, titanium nitride. The interlayer insulating layer 160 includes, for example, aluminum oxide.

Next, holes extending in the y direction are formed in the laminate. The hole penetrates through the laminate in the y direction. First, a hole pattern is formed on the laminate by a lithography method. The interlayer insulating layer 160 and the word line WL are alternately etched by the RIE method to form the hole.

Next, the first insulating film 31 is formed on a side surface of the hole formed in the laminate. The first insulating film 31 includes, for example, hafnium oxide. The hafnium oxide is amorphous just after the film formation. The first insulating film 31 is formed by, for example, the ALD method.

Next, the second insulating film 32 is formed on the first insulating film 31. The second insulating film 32 is formed by, for example, the CVD method. The second insulating film 32 includes, for example, silicon oxide.

Next, the semiconductor pillar SP is formed by burying the semiconductor layer on the second insulating film 32 in the hole. The semiconductor layer includes, for example, polycrystalline silicon formed by a CVD method.

Next, heat treatment is performed to crystallize hafnium oxide of the first insulating film 31. The heat treatment is performed, for example, in a nitrogen gas atmosphere at a temperature of 600° C. or more and 1050° C. or less for 1 second or more and 30 seconds or less. The heat treatment is so-called crystallization annealing.

By the heat treatment, the hafnium oxide between the word line WL and the semiconductor pillar SP is crystallized to be orthorhombic. On the other hand, the hafnium oxide between the interlayer insulating layer 160 and the semiconductor pillar SP is crystallized, but does not become orthorhombic, but becomes crystals other than the orthorhombic.

By the heat treatment, a first region 31a between the word line WL and the semiconductor pillar SP and a second region 31b between the interlayer insulating layer 160 and the semiconductor pillar SP are formed in the first insulating film 31. The first region 31a includes hafnium oxide mainly formed as the orthorhombic. The second region 31b includes hafnium oxide mainly formed as crystals other than the orthorhombic.

According to the above manufacturing method, the memory device of the third embodiment shown in FIGS. 10A and 10B is manufactured.

As described above, according to the third embodiment, as in the first and second embodiments, it is possible to realize the memory device in which the degradation of the memory characteristics due to the inter-cell interference is suppressed. In addition, a three-dimensional NAND flash memory using ferroelectrics is realized Fourth Embodiment A memory device of a fourth embodiment includes a first conductive layer, a second conductive layer, a resistance change layer provided between the first conductive layer and the second conductive layer, and a multi-layered insulator provided between the resistance change layer and a second conductive layer and including a first layer, a second layer, and a third layer, wherein the second layer is located between the first layer and the third layer, electron affinity of the first layer is larger than electron affinity of the second layer, and electron affinity of the second layer is larger than electron affinity of the third layer.

Figure 11:
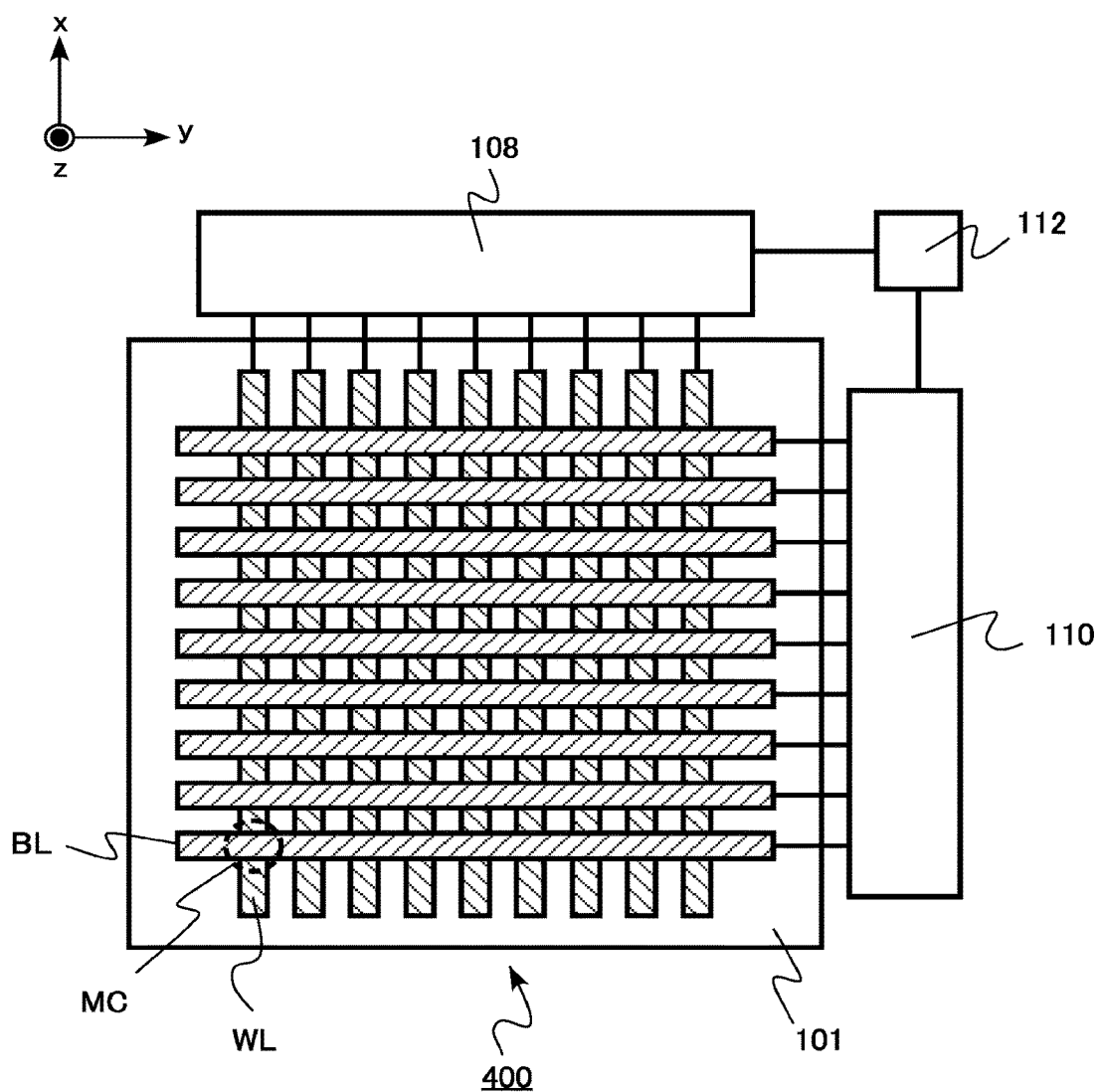
FIG. 11 is a block diagram of a memory cell array and a peripheral circuit of a memory device according to a fourth embodiment.

FIG. 11 is a block diagram of a memory cell array 400 and a peripheral circuit of a memory device according to a fourth embodiment. The memory device of the fourth embodiment is a resistive random access memory (ReRAM). A region indicated by a dotted circle in the memory cell array 400 of FIG. 11 is one memory cell MC.

Hereinafter, as shown in FIG. 11, an x direction is defined as a first direction, a y direction is defined as a second direction, and a z direction is defined as a third direction.

The memory cell array 400 of the memory device according to the fourth embodiment includes, for example, a plurality of word lines WLs and a plurality of bit lines BLs intersecting the word lines WLs on a semiconductor substrate 101 with an insulating layer interposed therebetween. The word line WL is provided under the bit line BL. In addition, a first control circuit 108, a second control circuit 110, and a sense circuit 112 are provided around the memory cell array 400 as peripheral circuits.

A plurality of memory cells MCs are provided in a region where the word line WL intersects the bit line BL. The memory device of the fourth embodiment is the ReRAM including a cross point structure. The memory cell MC is a two-terminal element.

Each of the plurality of word lines WLs is connected to the first control circuit 108. In addition, each of the plurality of bit lines BLs is connected to a second control circuit 110. The sense circuit 112 is connected to the first control circuit 108 and the second control circuit 110.

For example, the first control circuit 108 and the second control circuit 110 select a desired memory cell MC and have a function of wiring data into the memory cell, reading the data of the memory cell, erasing the data of the memory cell, and the like. When data are read out, the data of the memory cell is read out as the amount of current flowing between the word line WL and the bit line BL. The sense circuit 112 has a function of determining the current amount and determining polarity of the data. For example, the sense circuit 112 determines "0" or "1" of data. The sense circuit 112 determines the amount of tunnel current flowing in the memory cell to determine the polarity of the data.

The first control circuit 108, the second control circuit 110, and the sense circuit 112 are constituted by electronic circuits using semiconductor devices formed on the semiconductor substrate 101, for example.

Figure 12A:
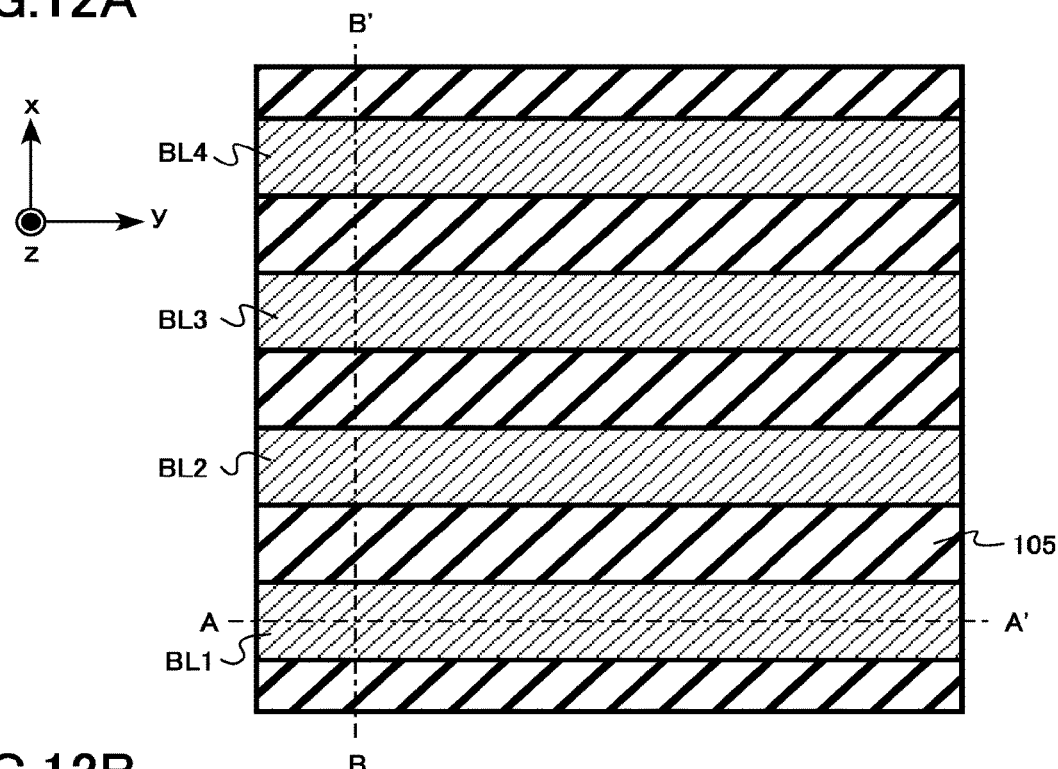
FIGS. 12A, 12B, and 12C are schematic views of a part of the memory cell array of the memory device of the fourth embodiment.
Figure 12B:
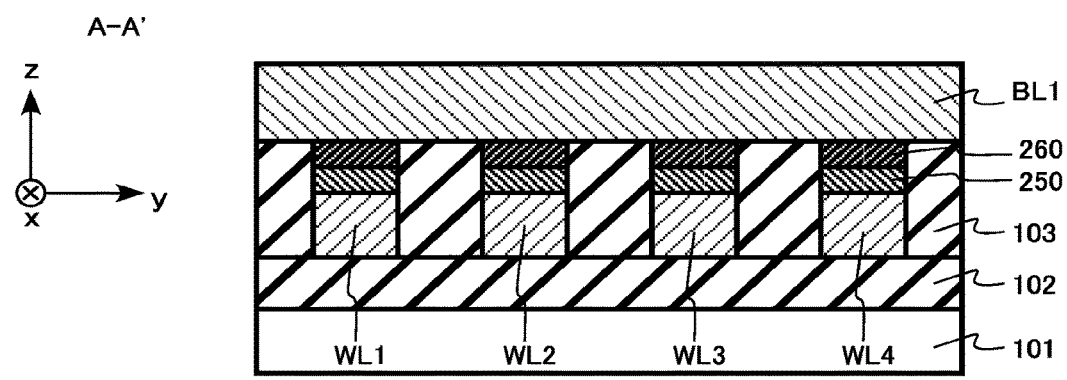
Figure 12C:
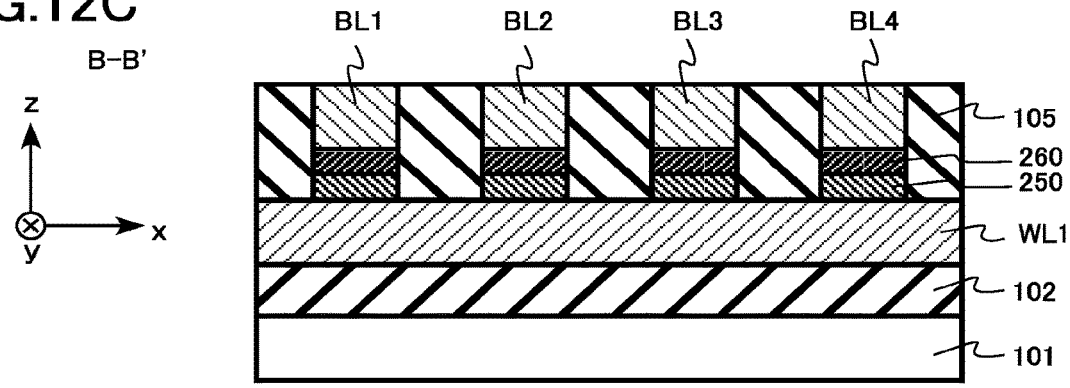

FIGS. 12A, 12B, and 12C are schematic views of a part of the memory cell array 400 of a memory device of the fourth embodiment. FIG. 12A is a top view, FIG. 12B is a cross-sectional view taken along the direction A-A' of FIG. 12A, and FIG. 12C is a cross-sectional view taken along the direction B-B' of FIG. 12A.

The memory cell array 400 includes a word line WL1 (a first conductive layer), a word line WL2, a word line WL3, a word line WL4, a bit line BL1 (a second conductive layer), a bit line BL2, a bit line BL3, a bit line BL4, a resistance change layer 250, a selector layer 260 (a multi-layered insulator), a semiconductor substrate 101, a first interlayer insulating layer 102, a second interlayer insulating layer 103, and a third interlayer insulating layer 105. Hereinafter, the word line WL1 (the first conductive layer), the word line WL2, the word line WL3, and the word line WL4 may be collectively referred to simply as the word line WL. In addition, the bit line BL1 (the second conductive layer), the bit line BL2, the bit line BL3, and the bit line BL4 may be collectively referred to simply as the bit line BL.

The word line WL extends in the x direction (the first direction). The word line WL is made of, for example, metal. The word line WL is made of, for example, metal having high heat resistance. The word line WL is made of, for example, titanium nitride (TiN), tungsten nitride (WN), tantalum nitride (TaN), tungsten (W), tantalum (Ta), niobium (Nb), vanadium (V), tungsten (W), iron (Fe), molybdenum (Mo), cobalt (Co), nickel (Ni), ruthenium (Ru), iridium (Ir), copper (Cu), palladium (Pd), silver (Ag), or platinum (Pt).

The bit line BL extends in the y direction (the second direction). The y direction (second direction) is orthogonal to the x direction. The bit line BL is made of, for example, metal. The bit line BL is made of, for example, metal having high heat resistance. The bit line BL is made of, for example, tungsten (W), titanium nitride (TiN), tungsten nitride (WN), tantalum nitride (TaN), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt).

The word line WL1 is an example of a first conductive layer. The bit line BL1 is an example of a second conductive layer.

The semiconductor substrate 101 is, for example, a silicon substrate.

The first interlayer insulating layer 102 is provided on the semiconductor substrate 101. The first interlayer insulating layer 102 is provided between the semiconductor substrate 101 and the word line WL. The first interlayer insulating layer 102 includes, for example, silicon oxide.

The second interlayer insulating layer 103 is provided between the word line WL and the word line WL. The second interlayer insulating layer 103 includes, for example, silicon oxide.

The third interlayer insulating layer 105 is provided on the word line WL. The third interlayer insulating layer 105 is provided between the bit line BL and the bit line BL. The third interlayer insulating layer 105 includes, for example, silicon oxide.

The resistance change layer 250 is provided between the word line WL and the bit line BL. By applying a current or voltage to the resistance change layer 250, the resistance change layer 250 changes from a high resistance state to a low resistance state or from the low resistance state to the high resistance state. The change from the high resistance state to the low resistance state is referred to as a set operation, for example. The change from the low resistance state to the high resistance state is referred to as the reset operation, for example.

For example, the high resistance state is defined as data "0", and the low resistance state is defined as data "1". The memory cell MC can store 1 bit data of "0" and "1".

A material of the resistance change layer 250 is not particularly limited as long as it is a material whose resistance state changes by application of a current or a voltage. For example, vacancy modulated conductive oxide is used as the resistance change layer 250.

The resistance change layer 250 is in contact with the selector layer 260.

The selector layer 260 is provided between the resistance change layer 250 and the bit line BL. The selector layer 260 is in contact with the resistance change layer 250 and the bit line BL.

In the selector layer 260, voltage-current characteristics have nonlinearity. The selector layer 260 has a function of suppressing a current flowing in a non-selected cell in writing, reading, or erasing a selected cell.

Figure 13:
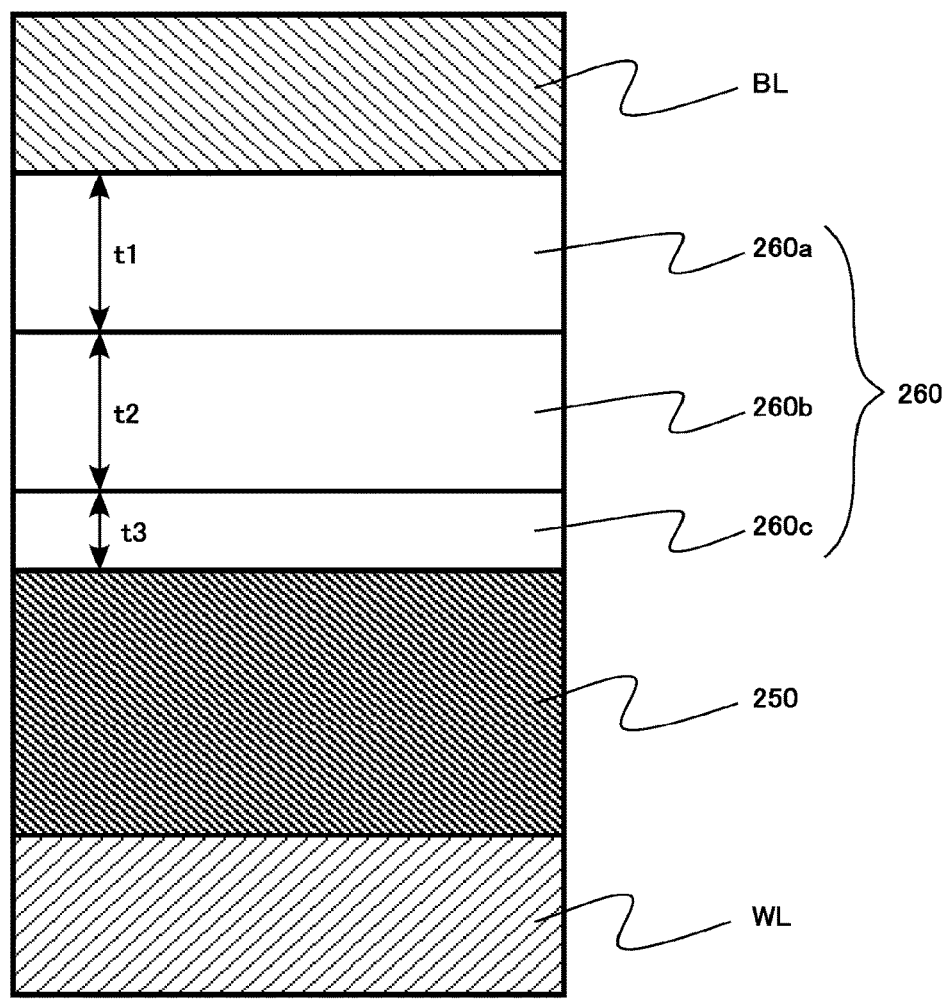
FIG. 13 is a schematic cross-sectional view of a memory cell of the memory device according to the fourth embodiment.

FIG. 13 is a schematic cross-sectional view of the memory cell of the memory device according to the fourth embodiment. FIG. 13 shows across section of, for example, one memory cell MC indicated by a dotted circle in the memory cell array 400 of FIG. 11.

The selector layer 260 has a multilayered structure. The selector layer 260 includes a first layer 260a, a second layer 260b, and a third layer 260c. The second layer 260b is provided between the first layer 260a and the third layer 260c. The first layer 260a is in contact with the second layer 260b and the second layer 260b is in contact with the third layer 260c.

Figure 14:
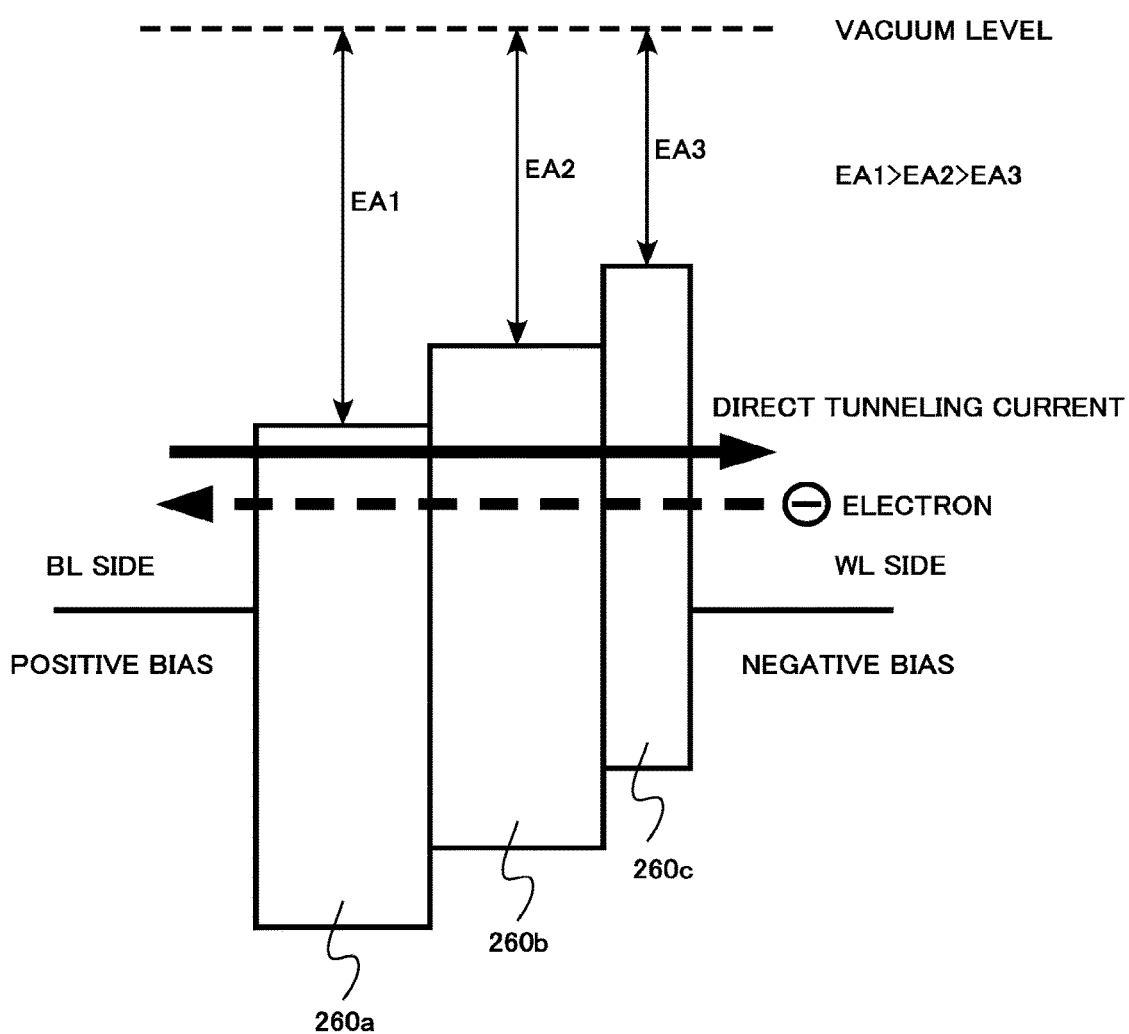
FIG. 14 is a band diagram of a selector layer of the memory device according to the fourth embodiment.

FIG. 14 is a band diagram of the selector layer of the memory device according to the fourth embodiment. Electron affinity (EA1) of the first layer 260a is larger than electric affinity (EA2) of the second layer 260b, and electron affinity of the second layer 260b is larger than electron affinity (EA3) of the third layer 260c. That is, the relationship of EA1>EA2>EA3 is established. The electron affinity is an energy difference between energy of a lower end of a conductor and a vacuum level.

In the selector layer 260, the energy of the lower end of the conductor changes in a stair form from the first layer 260a toward the third layer 260c.

The first layer 260a, the second layer 260b, and the third layer 260c are insulating layers. The first layer 260a, the second layer 260b, and the third layer 260c are, for example, oxide layers.

The first layer 260a includes, for example, titanium oxide. The second layer 260b includes, for example, tantalum oxide. The third layer film 260c includes, for example, silicon oxide or aluminum oxide.

A thickness of the selector layer 260 is, for example, 1 nm or more and 5 nm or less. A sum of a thickness (t1) of the first layer 260a, a thickness (t2) of the second layer 260b, and a thickness (t3) of the third layer 260c is, for example, 1 nm or more and 5 nm or less.

The thickness (t3) of the third layer 260c is, for example, thinner than the thickness (t1) of the first layer 260a and the thickness (t2) of the second layer 260b. The thickness (t3) of the third layer 260c is, for example, ½ or less of the thickness (t1) of the first layer 260a. The thickness (t3) of the third layer 260c is, for example, ½ or less of the thickness (t2) of the second layer 260b.

A voltage applied to the selector layer 260 is controlled so that a side of the first layer 260a becomes a positive voltage with respect to a side of the third layer 260c. In the memory device of the fourth embodiment, a voltage applied to the bit line BL (the second conductive layer) is controlled so that it is relatively positive with respect to the voltage applied to the word line WL (the first conductive layer).

When a positive voltage of a predetermined level or more is applied to the bit line BL, a direct tunneling current flows from the bit line BL side to the word line WL side. In other words, electrons flow in the bit line BL side by tunneling through the selector layer 260 from the word line WL side.

Next, functions and effects of the memory device according to the fourth embodiment will be described.

In the ReRAM having the cross point structure, it is necessary to suppress the current flowing in the non-selected cell when a voltage is applied to the selected cell to write, read, or erase the selected cell. A large current flowing in the non-selected cell is a factor of causing malfunctions such as a data write error, a data read error, and a data erase error.

In writing, reading, or erasing the selected cell, a voltage lower than the voltage applied to the selected cell is applied to the non-selected cell. For example, a half of the voltage applied to the selected cell is applied to the non-selected cell. Hereinafter, the voltage applied to the selected cell will be referred to as anon voltage Von, and the voltage applied to the non-selected cell will be referred to as an off voltage Voff. The off voltage Voff is, for example, a half of the on voltage Von.

The selector layer 260 is provided in each memory cell to suppress the current flowing in the non-selected cell. In the selector layer 260, the voltage-current characteristics have nonlinearity. Hereinafter, a current flowing in the selector layer 260 when the on voltage Von is applied is referred to as an on current Ion, and a current flowing in the selector layer 260 when an off voltage Voff is applied is referred to as an off current Ioff.

In the selector layer 260, a high on current Ion, a low off current Ioff, and high nonlinearity (Ion/Ioff) are required. In particular, when the thickness of the selector layer 260 becomes thin, it becomes particularly difficult to realize the low off current Ioff.

In the memory device of the fourth embodiment, the selector layer 260 is formed in three layers, and a stair-like band structure is provided. In this way, even when the thickness of the selector layer 260 becomes thin, it is possible to realize a high on current Ion, a low off current Ioff, and large nonlinearity (Ion/Ioff).

Figure 15A:
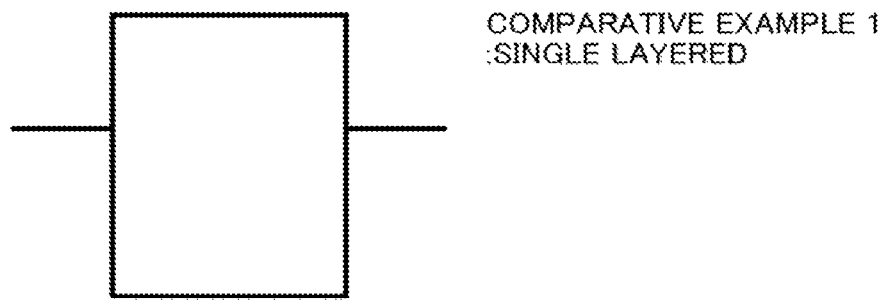
FIGS. 15A, 15B, and 15C are explanatory diagrams of functions and effects of the memory device according to the fourth embodiment.
Figure 15B:
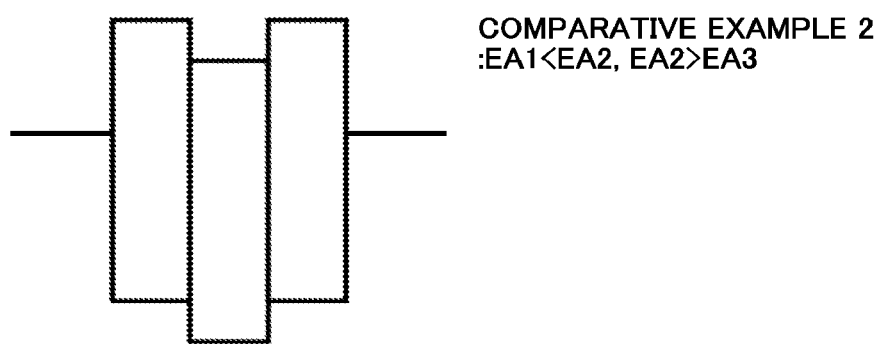
Figure 15C:
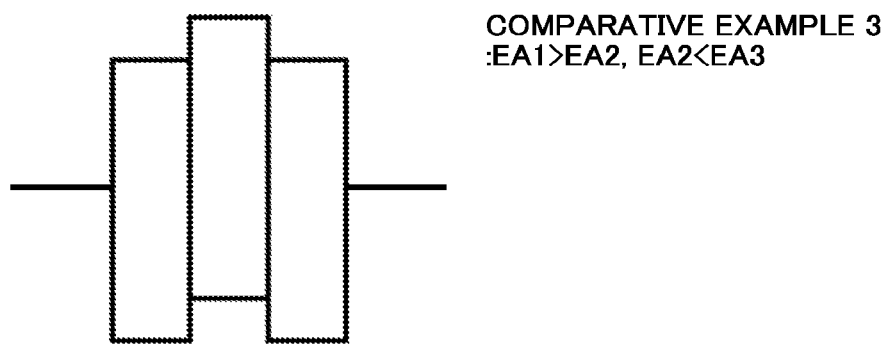

FIGS. 15A, 15B, and 15C are explanatory diagrams of functions and effects of the memory device according to the fourth embodiment. FIGS. 15A, 15B, and 15C are band diagrams of the selector layer of a comparative example. FIG. 15A shows a case in which a selector layer is a single layer (Comparative Example 1), FIG. 15B shows a case in which the selector layer is three layers but electron affinity of layers at both ends is small (Comparative Example 2), and FIG. 15C shows a case in which the selector layer is three layers but the electron affinity at both ends is large (Comparative Example 3).

Figure 16:
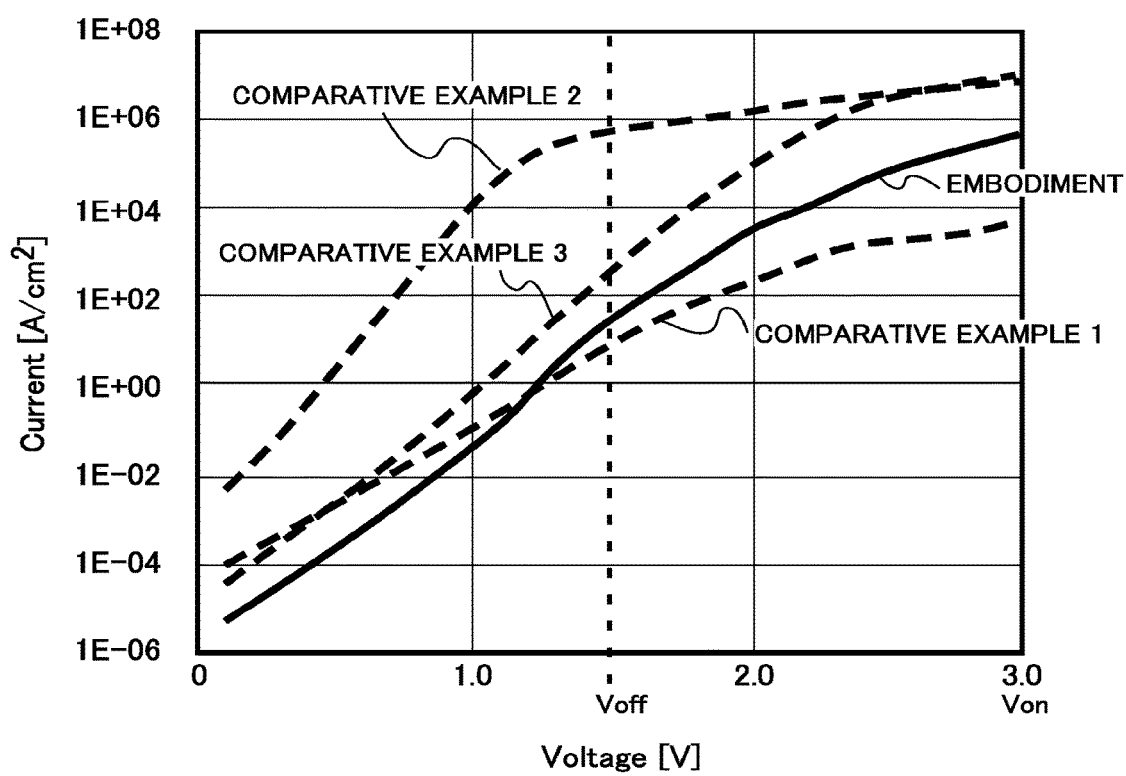
FIG. 16 is an explanatory diagram of functions and effects of the memory device of the fourth embodiment.

FIG. 16 is an explanatory diagram of functions and effects of the memory device of the fourth embodiment. FIG. 16 shows simulation results of the voltage-current characteristics of the selector layer of Comparative Example 1, Comparative Example 2, Comparative Example 3, and the fourth embodiment.

In Comparative Example 1, although the off current Toff is low, the on current Ion is also low, and the nonlinearity is also small. In Comparative Example 2, although the on current Ion is high, the off current Ioff is also high, and the nonlinearity is also small. In Comparative Example 3, although the on current Ion is high, the off current Toff is slightly high, and the nonlinearity is also slightly small.

On the other hand, in the case of the fourth embodiment, the high on current Ion, the low off current Ioff, and the large nonlinearity are realized. It is considered that the third layer 160c having the small electron affinity serves as an electron barrier and the off current Ioff is reduced. On the other hand, by making the electron affinity of the first layer 160a larger than that of the second layer 160b, it is considered that the on current Ion is suppressed from being lowered From the viewpoint of suppressing the on current Ion from being lowered, the thickness (t3) of the third layer 160c is, for example, thinner than the thickness (t1) of the first layer 160a and the thickness (t2) of the second layer 160b.

From the viewpoint of suppressing the on current Ion from being lowered, the thickness (t3) of the third layer 260c is preferably, for example, ½ or less of the thickness (t1) of the first layer 260a, and the thickness (t3) of the third layer 260c is preferably, for example, ½ or less of the thickness (t2) of the second layer 260b.

In addition, the thickness of the selector layer 260 is preferably 1 nm or more and 5 nm or less. Below the above range, the off current Ioff may increase. When it exceeds the above range, the on current Ion may decrease.

As described above, according to the fourth embodiment, by providing a selector layer having the high on current Ion, the low off current Ioff, and the high nonlinearity, the memory device with the suppressed malfunction is realized.

Fifth Embodiment

A memory device of a fifth embodiment is different from the memory device of the second embodiment in that the memory device further includes a multi-layered insulator provided between a first conductive layer and a first insulating film, wherein the multi-layered insulator includes a first layer, a second layer, and a third layer, the second layer is located between the first layer and the third layer, electron affinity of the first layer is larger than the electron affinity of the second layer and the electron affinity of the second layer is larger than the electric affinity of the third layer. Hereinafter, a description of the contents overlapping with the second embodiment is partially omitted.

The memory device of the fifth embodiment includes the selector layer 260 described in the fourth embodiment with respect to the memory device of the second embodiment. The structure of the selector layer 260 is the same as that of the fourth embodiment, and therefore a description thereof will be omitted.

Figure 17A:
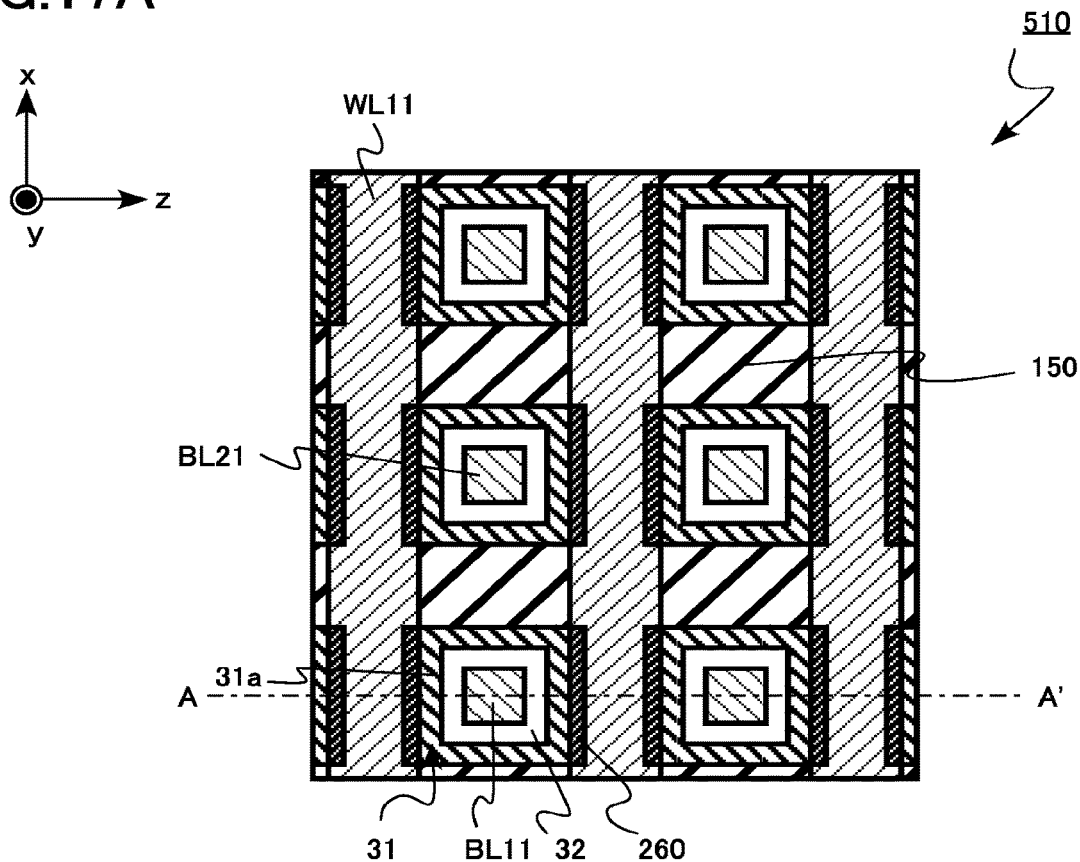
FIGS. 17A and 17B are schematic views of a part of a memory cell array of a memory device according to a fifth embodiment.
Figure 17B:
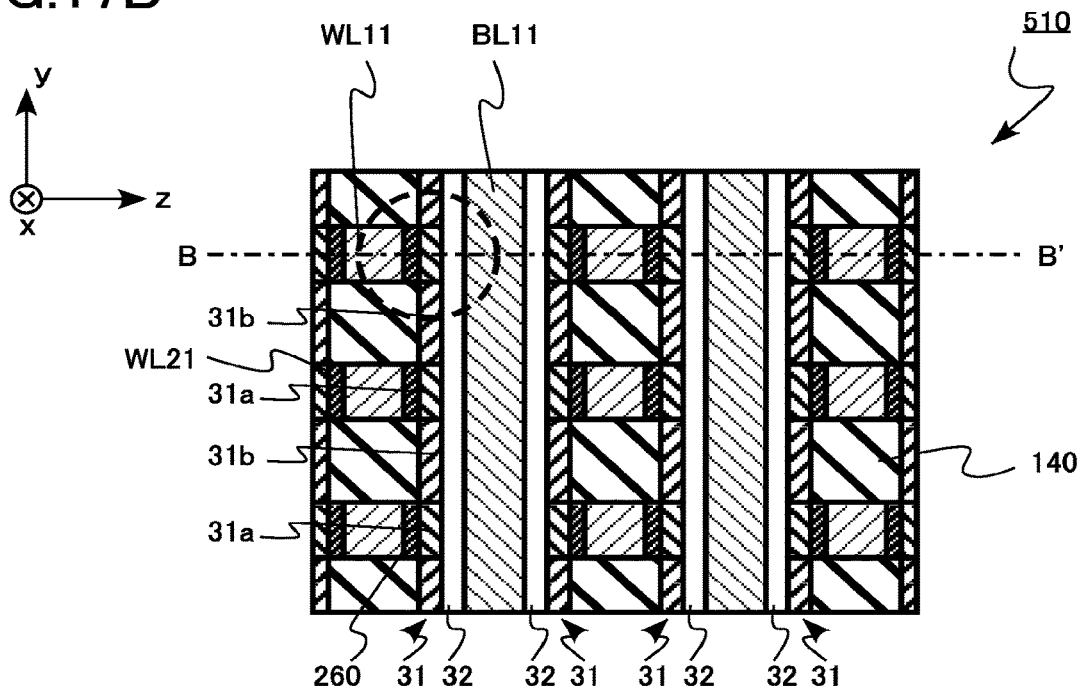

FIGS. 17A and 17B are schematic views of a part of a memory cell array 510 of the memory device according to the fifth embodiment. FIG. 17A is a cross-sectional view taken along xz of the memory cell array 510. FIG. 17B is a cross-sectional view taken along yz of the memory cell array 210. FIG. 17A is a cross-sectional view taken along line BB' of FIG. 17B, and FIG. 17B is a cross-sectional view taken along line AA' of FIG. 17A.

The memory cell array 510 includes a plurality of word lines including the word line WL11 (a first conductive layer) and the word line WL21 (a second conductive layer), a plurality of bit lines including the bit line BL11 (a third conductive layer) and the bit line BL21, a selector layer 260, a first insulating film 31, a second insulating film 32, a first interlayer insulating layer 140 (insulating layer), and a second interlayer insulating layer 150. Hereinafter, the plurality of word lines including the word line WL11 (the first conductive layer) and the word line WL12 (the second conductive layer) may be collectively referred to simply as the word line WL. In addition, the plurality of bit lines including the bit line BL11 (the third conductive layer) and the bit line BL12 may be collectively referred to simply as the bit line BL. The first insulating film 31 and the second insulating film 32 are an example of a resistance change layer.

The selector layer 260 is provided between the word line WL11 (the first conductive layer) and the first insulating film 31. The selector layer 260 is provided between the word line WL and a first region 31a of the first insulating film 31.

Figure 18:
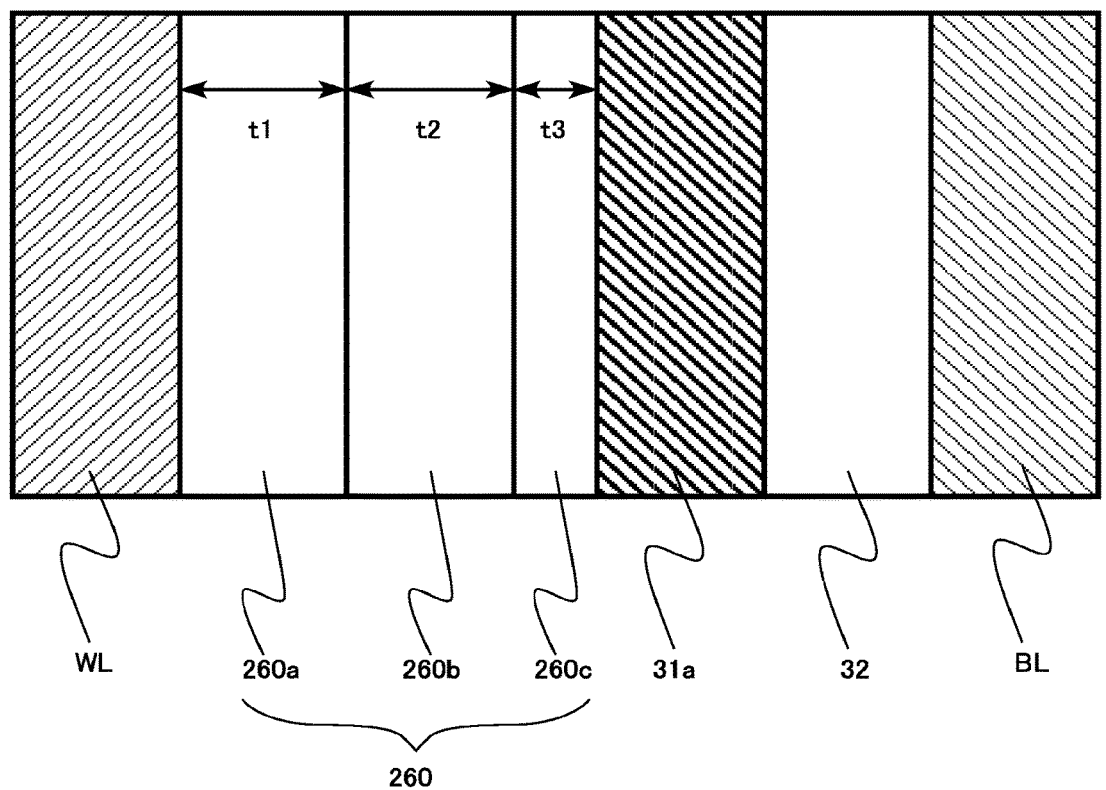
FIG. 18 is a schematic cross-sectional view of a memory cell of the memory device according to the fifth embodiment.

FIG. 18 is a schematic cross-sectional view of the memory cell of the memory device according to the fifth embodiment. FIG. 18 shows across section of, for example, one memory cell indicated by a dotted circle in the memory cell array 510 of FIG. 17B.

The selector layer 260 has a multilayered structure. The selector layer 260 includes a first layer 260a, a second layer 260b, and a third layer 260c. The second layer 260b is provided between the first layer 260a and the third layer 260c. The first layer 260a is in contact with the second layer 260b and the second layer 260b is in contact with the third layer 260c.

Electron affinity (EA1) of the first layer 260a is larger than electric affinity (EA2) of the second layer 260b, and electron affinity of the second layer 260b is larger than electron affinity (EA3) of the third layer 260c. That is, the relationship of EA1>EA2>EA3 is established.

A voltage applied to the selector layer 260 is controlled so that a side of the first layer 260a becomes a positive voltage with respect to a side of the third layer 260c. In the memory device of the fifth embodiment, the voltage applied to the word line WL is controlled to be relatively positive with respect to the voltage applied to the bit line BL.

When a positive voltage of a predetermined level or more is applied to the word line WL, a direct tunneling current flows from the word line WL side to the bit line BL side. In other words, electrons flow in the word line WL side by tunneling through the selector layer 260 from the bit line BL side As described above, according to the fifth embodiment, in addition to the effects of the second embodiment, by providing the selector layer having the high on current Ion, the low off current Ioff, and the high nonlinearity, the memory device with the suppressed malfunction is realized.

Sixth Embodiment

A memory device of a sixth embodiment is different from the memory device of the second embodiment in that the memory device further includes a multi-layered insulator provided between a second insulating film and a third conductive layer, wherein the multi-layered insulator includes a first layer, a second layer, and a third layer, the second layer is located between the first layer and the third layer, electron affinity of the first layer is larger than the electron affinity of the second layer and the electron affinity of the second layer is larger than the electric affinity of the third layer.
Hereinafter, a description of the contents overlapping with the second embodiment is partially omitted. The memory device of the sixth embodiment is different from the fifth embodiment in that a multi-layered insulator is provided between the second insulating film and the third conductive layer.

The memory device of the sixth embodiment includes the selector layer 260 described in the fourth embodiment with respect to the memory device of the second embodiment.

The structure of the selector layer 260 is the same as that of the fourth embodiment, and therefore a description thereof will be omitted.

Figure 19A:
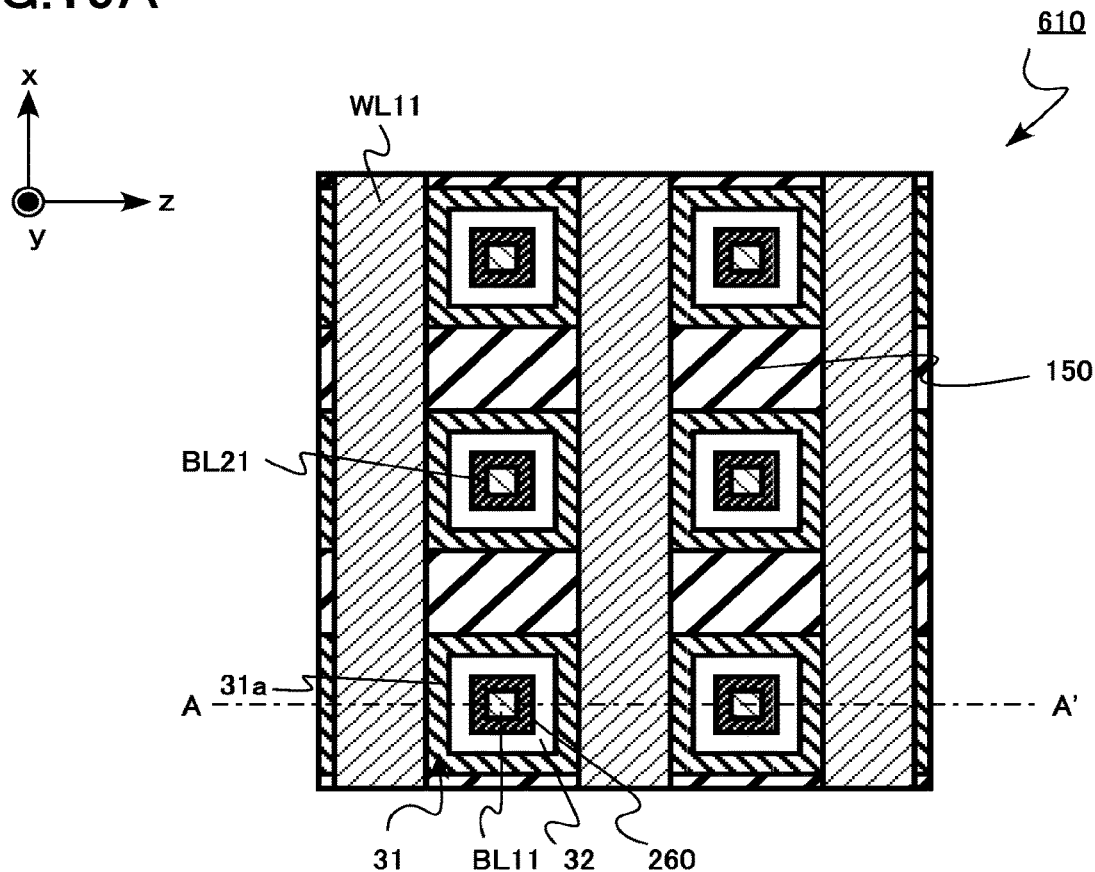
FIGS. 19A and 19B are schematic views of a part of a memory cell array of a memory device according to a sixth embodiment.
Figure 19B:
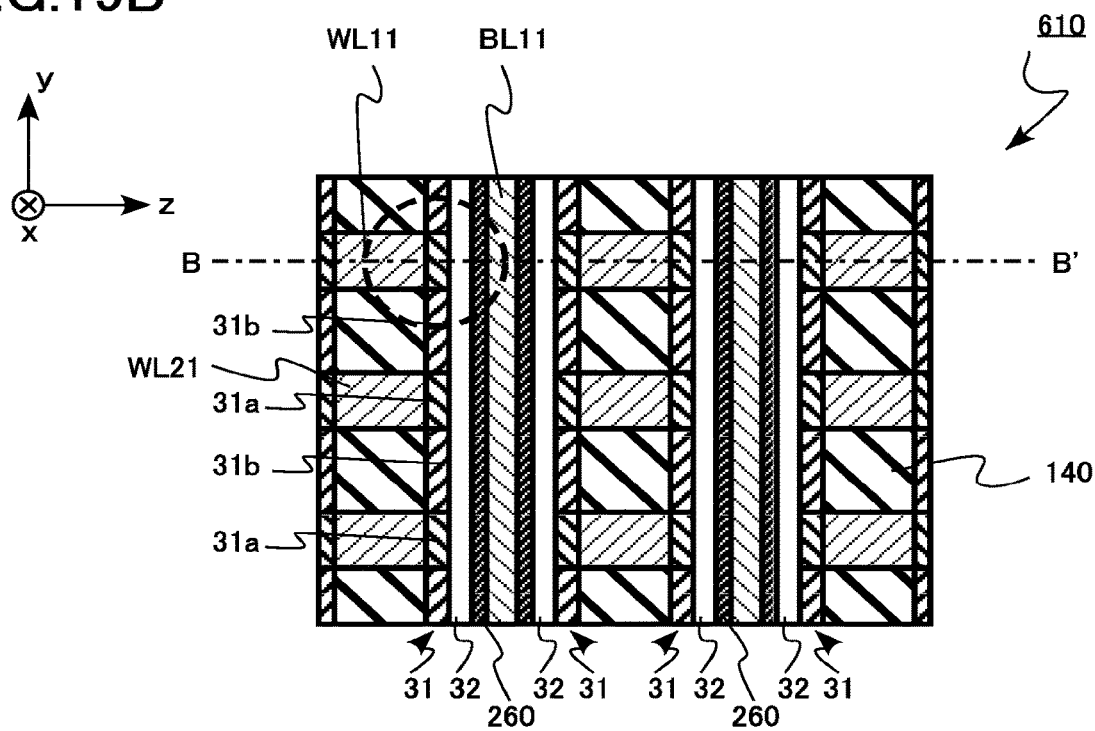

FIGS. 19A and 19B are schematic views of a part of the memory cell array 610 of the memory device according to the sixth embodiment. FIG. 19A is a cross-sectional view taken along xz of the memory cell array 610. FIG. 19B is a cross-sectional view taken along yz of the memory cell array 610. FIG. 19A is a cross-sectional view taken along line BB' of FIG. 19B, and FIG. 19B is a cross-sectional view taken along line AA' of FIG. 19A.

The memory cell array 610 includes a plurality of word lines including the word line WL11 (a first conductive layer) and the word line WL21 (a second conductive layer), a plurality of bit lines including the bit line BL11 (a third conductive layer) and the bit line BL21, the selector layer 260, a first insulating film 31, a second insulating film 32, a first interlayer insulating layer 140 (insulating layer), and a second interlayer insulating layer 150. Hereinafter, the plurality of word lines including the word line WL11 (the first conductive layer) and the word line WL12 (the second conductive layer) may be collectively referred to simply as the word line WL. In addition, the plurality of bit lines including the bit line BL11 (the third conductive layer) and the bit line BL12 may be collectively referred to simply as the bit line BL. The first insulating film 31 and the second insulating film 32 are an example of a resistance change layer.

The selector layer 260 is provided between the second insulating film 32 and the bit line BL (the third conductive layer).

Figure 20:
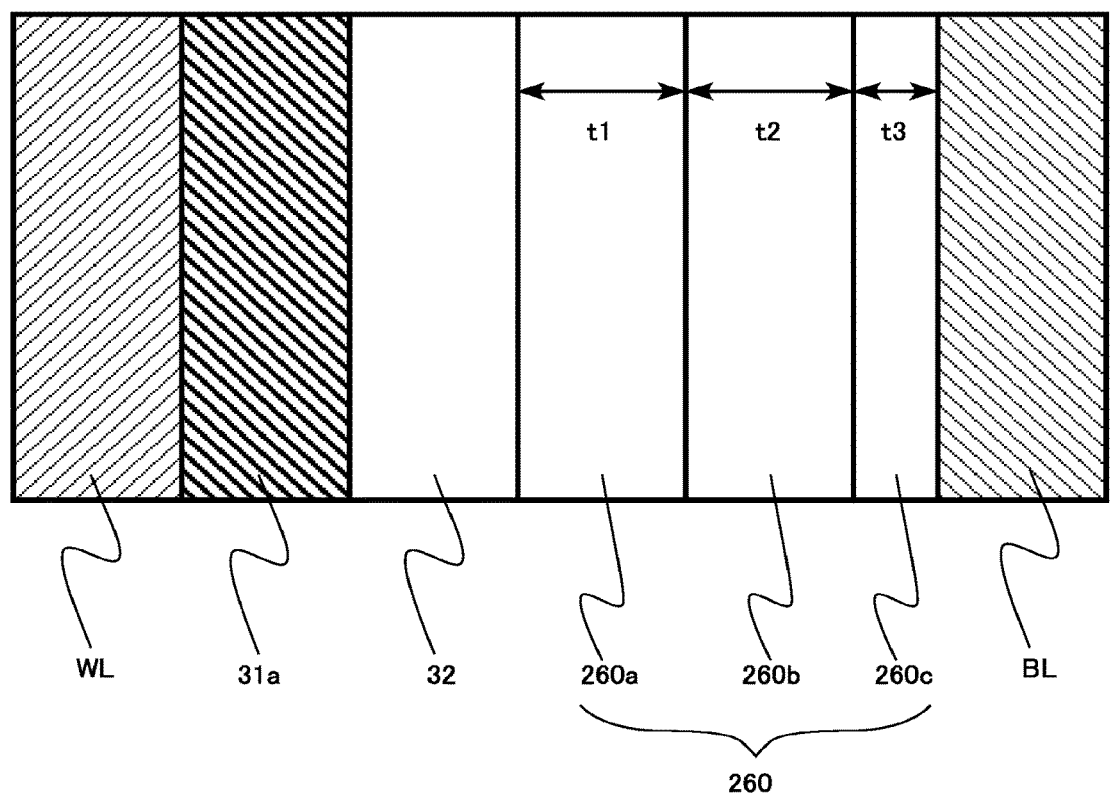
FIG. 20 is a schematic cross-sectional view of a memory cell of the memory device according to the sixth embodiment.

FIG. 20 is a schematic cross-sectional view of the memory cell of the memory device according to the sixth embodiment. FIG. 20 shows across section of, for example, one memory cell indicated by a dotted circle in the memory cell array 610 of FIG. 19B.

The selector layer 260 has a multilayered structure. The selector layer 260 includes a first layer 260a, a second layer 260b, and a third layer 260c. The second layer 260b is provided between the first layer 260a and the third layer 260c. The first layer 260a is in contact with the second layer 260b and the second layer 260b is in contact with the third layer 260c.

Electron affinity (EA1) of the first layer 260a is larger than electric affinity (EA2) of the second layer 260b, and electron affinity of the second layer 260b is larger than electron affinity (EA3) of the third layer 260c. That is, the relationship of EA1>EA2>EA3 is established.

A voltage applied to the selector layer 260 is controlled so that a side of the first layer 260a becomes a positive voltage with respect to a side of the third layer 260c. In the memory device of the sixth embodiment, the voltage applied to the word line WL is controlled to be relatively positive with respect to the voltage applied to the bit line BL.

When a positive voltage of a predetermined level or more is applied to the word line WL, a direct tunneling current flows from the word line WL side to the bit line BL side. In other words, electrons flow in the word line WL side by tunneling through the selector layer 260 from the bit line BL side.

As described above, according to the sixth embodiment, in addition to the effects of the second embodiment, by providing the selector layer having the high on current Ion, the low off current Ioff, and the high nonlinearity, the memory device with the suppressed malfunction is realized.

In the first and fourth embodiments, the case in which the cross point structure of the memory cell array is only one layer is described as an example, but it is also possible to form the three-dimensional structure in which the plurality of memory cell arrays of the first and fourth embodiments are stacked.

In the first embodiment, the case where the selector layer 260 is provided between the resistance change layer 250 and the bit line BL (second conductive layer) is described as an example, but the selector layer 260 may be provided between the word line (the first conductive layer) and the resistance change layer 250.

In the memory device of the fourth embodiment, the case where the voltage applied to the bit line BL is controlled to be relatively positive with respect to the voltage applied to the word line WL is described as an example, but the voltage applied to the word line WL can also be controlled to be relatively positive with respect to the voltage applied to the bit line BL. In this case, the first layer 260a is disposed on the word line WL side of the selector layer 260, and the third layer 260c is disposed on the bit line BL side of the selector layer 260.

In the memory device of the fifth and sixth embodiments, the case where the voltage applied to the word line WL is controlled to be relatively positive with respect to the voltage applied to the bit line BL is described as an example, but the voltage applied to the bit line BL can also be controlled to be relatively positive with respect to the voltage applied to the word line WL. In this case, the first layer 260a is disposed on the bit line BL side of the selector layer 260, and the third layer 260c is disposed on the word line WL side of the selector layer 260.

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
    a first conductive layer extending in a first direction;
    a second conductive layer extending in the first direction;
    a third conductive layer extending in a second direction intersecting the first direction and including metal;
    an insulating layer provided between the first conductive layer and the second conductive layer, the insulating layer including aluminum oxide; and
    a first insulating film including a first region and a second region, the first region located between the first conductive layer and the third conductive layer, the first region including hafnium oxide whose main crystal structure is orthorhombic, the second region located between the insulating layer and the third conductive layer, and the second region including hafnium oxide whose main crystal structure is crystal structure other than orthorhombic.

2. The memory device according to claim 1, wherein the first conductive layer and the second conductive layer include metal.

3. The memory device according to claim 2, wherein the first conductive layer and the second conductive layer include at least one of titanium nitride, tantalum nitride, or tungsten nitride.

4. The memory device according to claim 1, wherein the third conductive layer includes at least one of tungsten or titanium nitride.

5. The memory device according to claim 1, wherein a composition of the first region and a composition of the second region are substantially the same.

6. The memory device according to claim 1, wherein the first region includes ferroelectrics and the second region includes paraelectrics.

7. The memory device according to claim 1, further comprising:
    a second insulating film provided between the first insulating film and the third conductive layer, the second insulating film not including aluminum oxide.

8. The memory device according to claim 7, wherein the second insulating film includes at least one of silicon oxide or titanium oxide.

9. The memory device according to claim 1, wherein
    the first insulating film further includes a third region which is located between the second conductive layer and the third conductive layer, and
    the third region includes hafnium oxide whose main crystal structure is orthorhombic.

10. A memory device comprising:
    a first conductive layer extending in a first direction;
    a second conductive layer extending in the first direction;
    a third conductive layer extending in a second direction intersecting the first direction;
    an insulating layer provided between the first conductive layer and the second conductive layer, the insulating layer including aluminum oxide;
    a first insulating film including a first region and a second region, the first region located between the first conductive layer and the third conductive layer, the first region including hafnium oxide whose main crystal structure is orthorhombic, the second region located between the insulating layer and the third conductive layer, and the second region including hafnium oxide whose main crystal structure is crystal structure other than orthorhombic; and
    a second insulating film provided between the first insulating film and the third conductive layer, the second insulating film including paraelectrics and not including aluminum oxide.

11. A memory device comprising:
    a first conductive layer extending in a first direction;
    a second conductive layer extending in the first direction;
    a third conductive layer extending in a second direction intersecting the first direction;
    an insulating layer provided between the first conductive layer and the second conductive layer, the insulating layer including aluminum oxide;
    a first insulating film including a first region and a second region, the first region located between the first conductive layer and the third conductive layer, the first region including hafnium oxide whose main crystal structure is orthorhombic, the second region located between the insulating layer and the third conductive layer, and the second region including hafnium oxide whose main crystal structure is crystal structure other than orthorhombic;
    a second insulating film provided between the first insulating film and the third conductive layer, the second insulating film not including aluminum oxide; and a multi-layered insulator provided between the first conductive layer and the first insulating film or between the second insulating film and the third conductive layer, wherein the multi-layered insulator has a first layer, a second layer, and a third layer, the second layer is located between the first layer and the third layer, electron affinity of the first layer is larger than electron affinity of the second layer, and the electron affinity of the second layer is larger than electron affinity of the third layer.

12. The memory device according to claim 11, wherein a thickness of the third layer is thinner than a thickness of the first layer and a thickness of the second layer.

* * * * *